(12) United States Patent
Aggarwal et al.

(10) Patent No.: US 8,927,435 B2
(45) Date of Patent: Jan. 6, 2015

(54) LOAD LOCK HAVING SECONDARY ISOLATION CHAMBER

(71) Applicant: ASM America, Inc., Phoenix, AZ (US)

(72) Inventors: Ravinder K. Aggarwal, Gilbert, AZ (US); Jeroen Stoutjesdijk, Phoenix, AZ (US); Eric R. Hill, Goodyear, AZ (US); Loring G. Davis, Phoenix, AZ (US); John T. DiSanto, Scottsdale, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 13/889,810

(22) Filed: May 8, 2013

(65) Prior Publication Data

US 2013/0239879 A1 Sep. 19, 2013

Related U.S. Application Data

(62) Division of application No. 12/695,072, filed on Jan. 27, 2010, now Pat. No. 8,440,048.

(60) Provisional application No. 61/147,974, filed on Jan. 28, 2009.

(51) Int. Cl.

| H01L 21/302 | (2006.01) |
|---|---|
| H01L 21/461 | (2006.01) |
| C30B 25/02 | (2006.01) |
| H01L 21/67 | (2006.01) |
| C30B 23/00 | (2006.01) |
| C30B 23/02 | (2006.01) |
| C30B 25/16 | (2006.01) |

(52) U.S. Cl.
CPC ........ *C30B 25/025* (2013.01); *H01L 21/67201* (2013.01); *C30B 23/002* (2013.01); *C30B 23/02* (2013.01); *C30B 25/16* (2013.01)
USPC .......... 438/706; 438/707; 438/711; 438/715; 438/716; 156/345.1; 156/345.29; 156/345.31; 156/345.32

(58) Field of Classification Search
CPC ................... H01L 21/67167; H01L 21/67207; H01L 21/67196; H01L 21/67201; H01L 21/02057
See application file for complete search history.

(56) References Cited

U.S. PATENT DOCUMENTS

| 4,836,138 A | 6/1989 | Robinson et al. |
|---|---|---|
| 4,895,107 A | 1/1990 | Yano et al. |

(Continued)

FOREIGN PATENT DOCUMENTS

| EP | 0834907 | 8/1998 |
|---|---|---|
| JP | 06-275703 | 9/1994 |

*Primary Examiner* — Duy Deo
(74) *Attorney, Agent, or Firm* — Knobbe, Martens, Olson & Bear LLP

(57) ABSTRACT

A load lock includes a chamber including an upper portion, a lower portion, and a partition between the upper portion and the lower portion, the partition including an opening therethrough. The load lock further includes a first port in communication with the upper portion of the chamber and a second port in communication with the lower portion of the chamber. The load lock includes a rack disposed within the chamber and a workpiece holder mounted on a first surface of the rack, wherein the rack and the workpiece holder are movable by an indexer that is capable of selectively moving wafer slots of the rack into communication with the second port. The indexer can also move the rack into an uppermost position, at which the first surface of the boat and the partition sealingly separate the upper portion and the lower portion to define an upper chamber and a lower chamber. Auxiliary processing, such as wafer pre-cleaning, or metrology can be conducted in the upper portion.

23 Claims, 11 Drawing Sheets

(56) References Cited

U.S. PATENT DOCUMENTS

| | | |
|---|---|---|
| 4,951,601 A | 8/1990 | Maydan et al. |
| 5,071,460 A | 12/1991 | Fujiura et al. |
| 5,080,549 A | 1/1992 | Goodwin et al. |
| 5,223,001 A | 6/1993 | Saeki |
| 5,391,035 A | 2/1995 | Krueger |
| 5,520,742 A | 5/1996 | Ohkase |
| 5,520,743 A | 5/1996 | Takahashi |
| 5,538,390 A | 7/1996 | Salzman |
| 5,571,330 A | 11/1996 | Kyogoku |
| 5,586,585 A | 12/1996 | Bonora et al. |
| 5,609,459 A | 3/1997 | Muka |
| 5,613,821 A | 3/1997 | Muka et al. |
| 5,630,690 A | 5/1997 | Salzman |
| 5,664,925 A | 9/1997 | Muka et al. |
| 5,683,072 A | 11/1997 | Ohmi et al. |
| 5,697,750 A | 12/1997 | Fishkin et al. |
| 5,730,801 A | 3/1998 | Tepman et al. |
| 5,752,796 A | 5/1998 | Muka |
| 5,810,538 A | 9/1998 | Ozawa et al. |
| 5,855,675 A | 1/1999 | Doering et al. |
| 5,857,848 A | 1/1999 | Takahashi et al. |
| 5,883,017 A | 3/1999 | Tepman et al. |
| 6,022,586 A | 2/2000 | Hashimoto et al. |
| 6,048,154 A | 4/2000 | Wytman |
| 6,053,686 A | 4/2000 | Kyogoku |
| 6,059,507 A * | 5/2000 | Adams .................. 414/217 |
| 6,074,538 A | 6/2000 | Ohmi et al. |
| 6,096,135 A | 8/2000 | Guo et al. |
| 6,162,006 A | 12/2000 | Stevens et al. |
| 6,162,299 A | 12/2000 | Raaijmakers |
| 6,234,107 B1 | 5/2001 | Tanaka et al. |
| 6,264,804 B1 | 7/2001 | Lee et al. |
| 6,280,134 B1 * | 8/2001 | Nering .................. 414/217 |
| 6,283,060 B1 | 9/2001 | Yamazaki et al. |
| 6,464,825 B1 | 10/2002 | Shinozaki |
| 6,551,044 B1 | 4/2003 | Stevens |
| 6,609,869 B2 | 8/2003 | Aggarwal et al. |
| 6,743,329 B1 * | 6/2004 | Kyogoku et al. ........ 156/345.32 |
| 7,018,504 B1 | 3/2006 | Raaijmakers et al. |
| 7,021,881 B2 | 4/2006 | Yamagishi et al. |
| 7,159,599 B2 | 1/2007 | Verhaverbeke et al. |
| 7,467,916 B2 | 12/2008 | Yamagishi et al. |
| 7,748,542 B2 | 7/2010 | Yudovsky et al. |
| 8,440,048 B2 | 5/2013 | Aggarwal et al. |
| 2009/0092466 A1 | 4/2009 | Moore et al. |

* cited by examiner

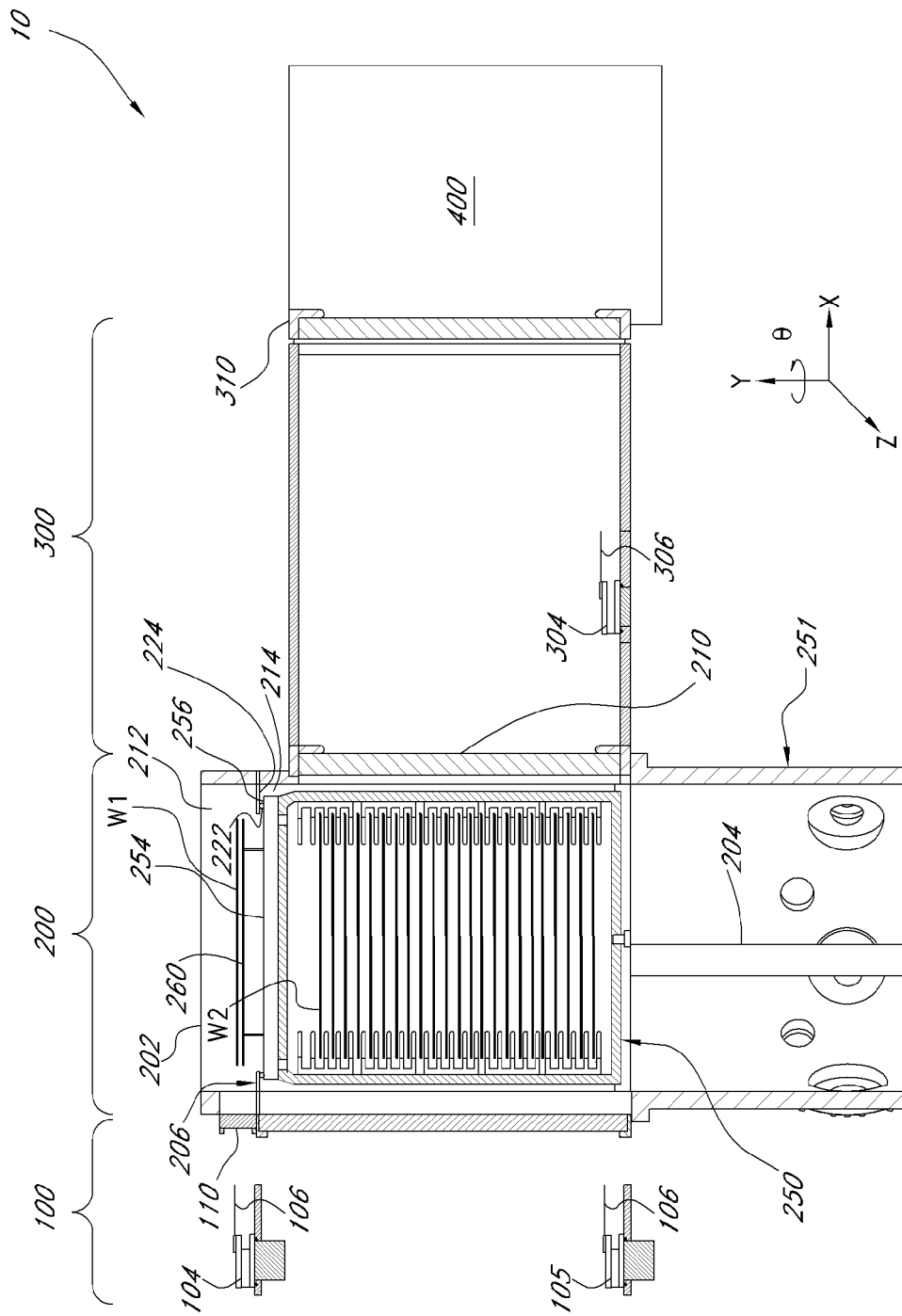

LOAD LOCK HAVING SECONDARY ISOLATION CHAMBER

CLAIM FOR PRIORITY

The present application is a divisional of and claims the priority benefit under 35 U.S.C. §120 to U.S. application Ser. No. 12/695,072, filed on Jan. 27, 2010, which claims the benefit to U.S. Provisional Patent Application No. 61/147, 974, filed Jan. 28, 2009, the entire contents of these applications are hereby incorporated herein by reference in their entirety.

FIELD OF THE INVENTION

The present invention relates to systems and methods for handling and processing semiconductor wafers and, in particular, to a load lock apparatus with a secondary isolation chamber.

BACKGROUND OF THE INVENTION

In the processing of semiconductor devices, such as transistors, diodes, and integrated circuits, a plurality of such devices are typically fabricated simultaneously on a thin slice of semiconductor material, termed a substrate, wafer, or workpiece. When manufacturing such semiconductor devices, it is desirable that the wafer does not become contaminated by particulates, which may lead to device failure. Accordingly, wafer processing systems typically include a multi-wafer load lock apparatus that provides a substantially particle free environment into which a batch or "lot" of wafers may be inserted while waiting to be processed. After wafers are loaded into the load lock, the load lock is evacuated to remove any particulates. The load lock is then backfilled with a purified gas, for example an inert gas, either to the ambient pressure or to a reduced pressure. A single wafer or a plurality of wafers may then be selectively withdrawn from the load lock for placement into one or more processing modules without opening the load lock to the ambient environment. After processing of the wafers in the process module and placement back into the load lock, the load lock is backfilled to ambient pressure, if necessary, and opened to the ambient environment. The wafers are then unloaded and the process is repeated.

An auxiliary process may be performed on a wafer in an auxiliary processing module before or after it is processed in a main processing module. Examples of such auxiliary processing include measuring, testing or cleaning the wafer before or after the main wafer processing has been performed on the wafer in a main process module, to further improve the quality of the processing of the wafer, or of subsequent wafers. In systems comprising a traditional multi-wafer load lock, at least one wafer is typically removed from the load lock and transported to an off-line tool or side chamber to undergo such auxiliary processing. To remove the wafer for auxiliary processing, the entire load lock is brought to atmospheric pressure before a loading port can be opened. Once the port is opened, all of the wafers in the load lock are exposed to the ambient environment, which can be detrimental in certain processing applications by introducing particulates into the load lock from the ambient environment. Backfilling and re-evacuating of the load lock every time a wafer is removed for auxiliary processing, whether before or after main processing, also results in low throughput, which is the number of wafers that are processed in a certain period of time.

Accordingly, a need exists for a load lock apparatus that will allow at least one wafer to be processed in an auxiliary process chamber without prematurely exposing the remaining wafers to the ambient environment and without reducing the throughput of wafers.

SUMMARY OF THE INVENTION

One embodiment provides a load lock, comprising a chamber including an upper portion, a lower portion, and a partition between the upper portion and the lower portion, the partition including an opening therethrough. The load lock comprises a first port in communication with the upper portion of the chamber, and a second port in communication with the lower portion of the chamber. The load lock comprises a boat disposed within the chamber. The load lock comprises a workpiece holder mounted on a first surface of the boat, the boat and the workpiece holder movable by a boat handler. The first surface of the boat and the partition are configured to sealingly separate the upper portion and the lower portion to define an upper chamber and a lower chamber.

Another embodiment provides a method of transporting workpieces. The method comprises loading a workpiece into a boat through a first port in communication with a first portion of a chamber of a load lock, the boat disposed in the chamber. The method comprises transferring the workpiece to a workpiece holder mounted on a first surface of the boat. The method comprises moving the boat towards a partition between the first portion of the chamber and a second portion of the chamber to sealably engage the partition with the first surface of the boat. Moving the boat comprises moving the workpiece holder into the second portion of the chamber. The method comprises sealably engaging the partition with the first surface of the boat, increasing the pressure of the second portion of the chamber, and unloading the workpiece through a second port in communication with the second portion of the chamber.

Another embodiment provides a semiconductor workpiece boat. The boat comprises a plurality of workpiece support structures configured to hold at least five workpieces. The boat comprises a workpiece holder mounted on a first surface of the boat, wherein the first surface is substantially solid and continuous and is over the plurality of workpiece support structures.

Another embodiment provides a load lock chamber. The load lock chamber comprises a first portion sized and shaped to accommodate less than five workpieces. The load lock comprises a second portion sized and shaped to accommodate greater than five workpieces. The load lock comprises a partition between the first portion and the second portion. The partition is configured to sealably separate the first portion and the second portion.

Another embodiment provides a method of processing a substrate. The method comprises loading a substrate onto a workpiece holder in a load lock. The load lock comprises a chamber having a first portion, a second portion, and a partition between the first portion and the second portion. The workpiece holder is moveable between the first portion and the second portion. The method comprises sealing the first portion from the second portion by sealingly engaging a boat with the partition. The workpiece holder is mounted on the boat. The method comprises pre-cleaning the substrate by introducing cleaning chemicals into the second portion of the load lock. The method comprises unloading the substrate from the workpiece holder. The method comprises transferring the substrate from the load lock to a process chamber.

The method comprises performing an epitaxial deposition process on the substrate in the process chamber.

For purposes of summarizing the invention and the advantages achieved over the prior art, certain objects and advantages of the invention have been described above and as further described below. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

These and other features, aspects, and advantages of the invention disclosed herein are described below with reference to the drawings of preferred embodiments, which are intended to illustrate and not to limit the invention.

FIGS. 3A-3E are cross-sectional views of the semiconductor processing apparatus of FIG. 1 at various points of a process sequence.

DETAILED DESCRIPTION OF THE PREFERRED EMBODIMENT

Figure 1:
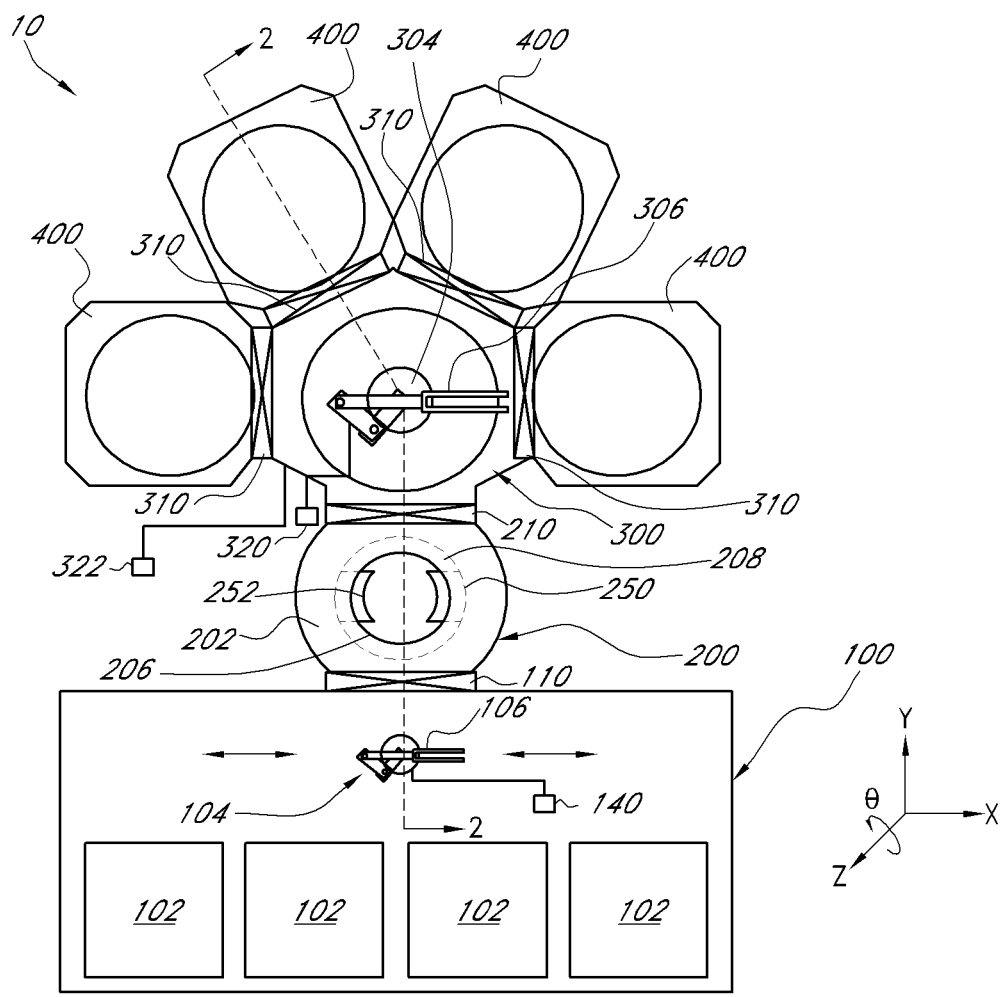
FIG. 1 is a schematic plan view of an example embodiment of a semiconductor processing apparatus including a load lock comprising a secondary isolation chamber.

Referring to FIG. 1, a schematic plan view of an example embodiment of a semiconductor processing apparatus 10 is shown. The illustrated semiconductor processing apparatus 10 includes a loading station 100, a load lock 200, a workpiece handling chamber 300, and a plurality of process modules 400.

Figure 2:
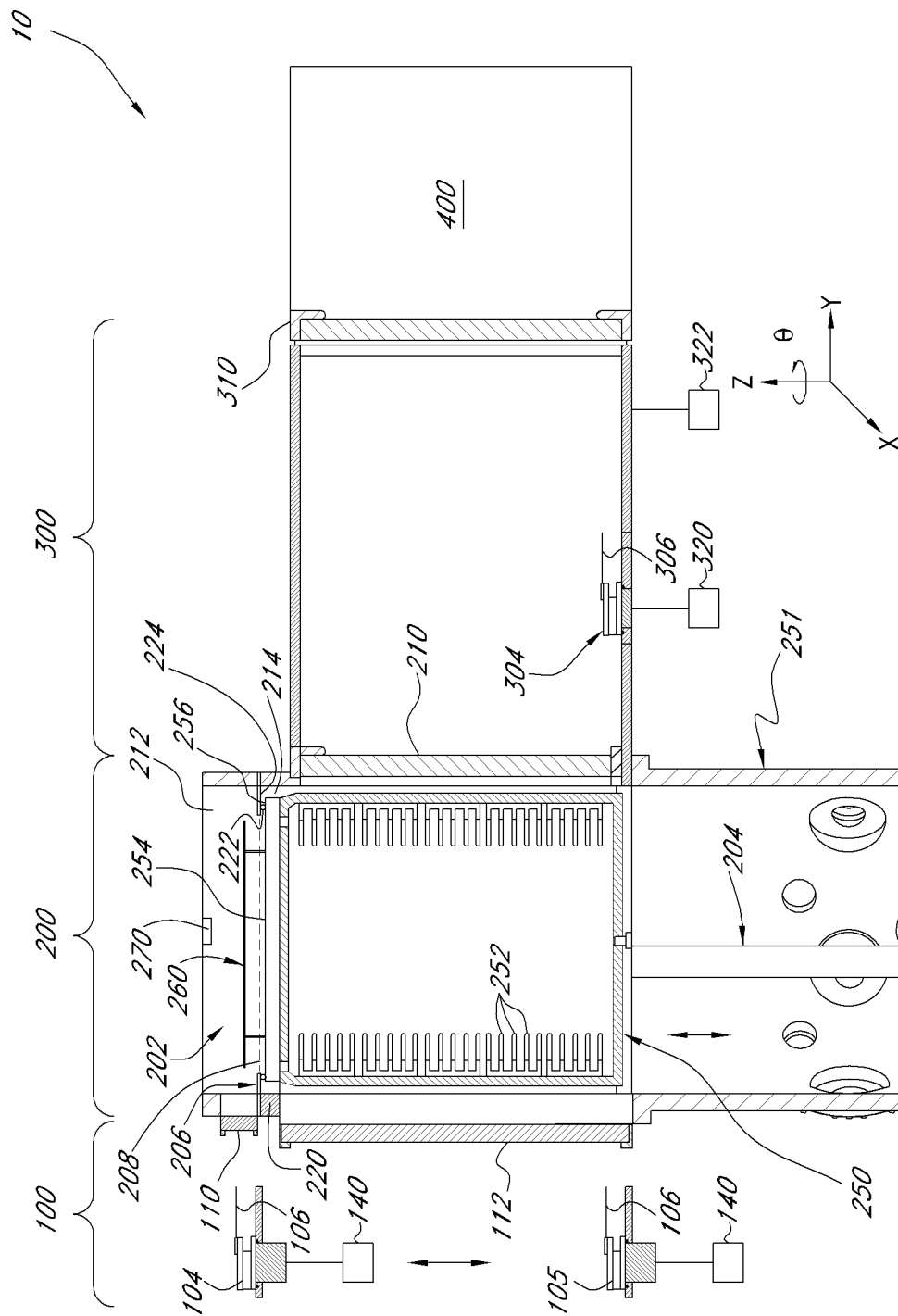
FIG. 2 is a cross-sectional view of the semiconductor processing apparatus of FIG. 1 taken along the line 2-2.
Figure 3A:
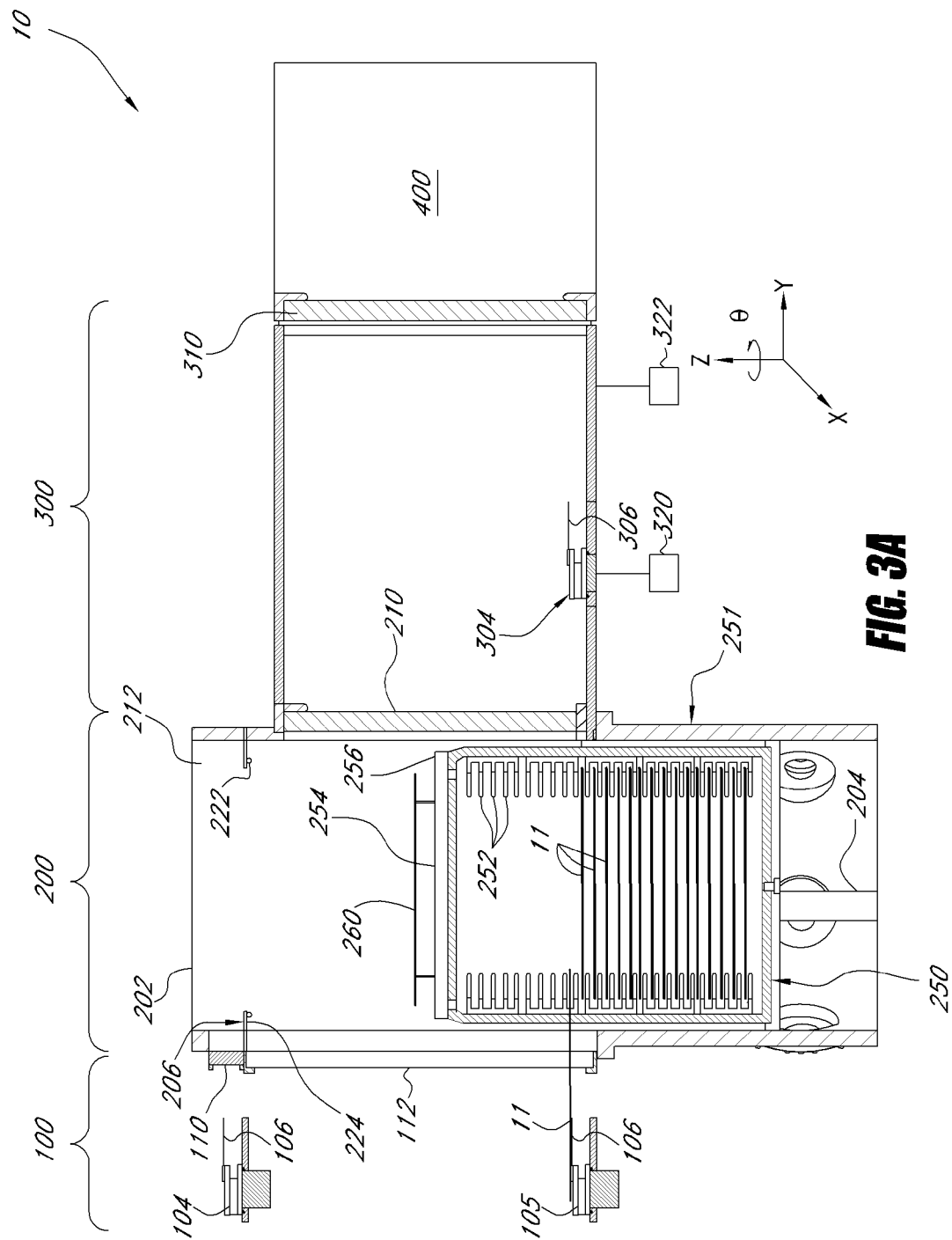

As shown in FIGS. 1-2, the loading station 100 is the location at which wafers 11 (FIG. 3A) are introduced or withdrawn from the semiconductor processing apparatus 10. The terms "semiconductor wafer" and/or "wafer" as used herein may refer to a substrate as it may exist in any of the various stages of the semiconductor fabrication process or may refer to a substrate that is used to validate a semiconductor fabrication process. The loading station 100 can be exposed to the ambient environment, for example the clean room environment external to the semiconductor processing apparatus 10, or can be a closed and purged environment. In some embodiments, the loading station 100 is at atmospheric pressure, as in an "Atmospheric Front End" ("AFE"). In certain embodiments, the loading station 100 includes docks or "load ports" 102 and a wafer handling unit 104. In some embodiments, the loading station 100 includes one load port 102. Each load port 102 is configured to stably receive a cassette (not shown) of wafers 11 (FIG. 3A). The wafer handling unit 104 is configured to transfer wafers from each cassette on the load ports 102 to the load lock 200.

In the illustrated embodiment of FIGS. 1-2, the wafer handling unit 104 includes an arm 106 that is extendable. The extendable arm 106 is configured to lift wafers 11, or to otherwise remove the wafers, from a cassette and to transfer the wafer into the load lock 200. In certain embodiments, the extendable arm 106 is formed of an end effector. In certain such embodiments, the wafer handling unit 104 includes an air source 140 operatively connected to the arm 106 such that the wafers 11 are held securely by the arm 106. The air source 140 provides air flow through the arm 106 to maneuver the wafer 11 without mechanically grasping the wafer 11. In some embodiments, the air source 140 can be a vacuum source that is configured to hold wafers 11 to the arm 106 with a vacuum. In certain embodiments, the extendable arm 106 mechanically grasps the wafer 11 along the edges, the top surface, the bottom surface, or a combination thereof. In some embodiments, the wafer handling unit 104 includes a plurality of arms 106 or a plurality of end effectors configured to transport multiple wafers 11 into the load lock 200. It should be understood by one skilled in the art that any mechanism capable of transferring wafers between a cassette and the load lock 200 can be used.

In certain embodiments, the loading station 100 includes a single wafer handling unit 104 that is translatable in the z-direction, as shown in FIGS. 1-3E and 7, to allow the arm 106 to access both an upper port 110 and a lower port 112 of the load lock 200. In some embodiments, as shown in FIGS. 1-2 and 3A-3E, the loading station 100 includes a pair of wafer handling units 104, 105, wherein the upper wafer handling unit 104 accesses the upper port 110 and the lower wafer handling unit 105 accesses the lower port 112. In certain such embodiments, neither of the wafer handling units 104, 105 is translatable in the z-direction with respect to the load lock 200, and neither of the wafer handling units 104, 105 is capable of accessing the port 110, 112 adjacent to the other wafer handling unit. In certain other such embodiments, both of the wafer handling units 104, 105 are translatable in the z-direction with respect to the load lock 200, and both of the wafer handling units 104, 105 are capable of accessing both of the ports 110, 112. It should be understood by one skilled in the art that the wafer handling units 104, 105 can be selectively movable in the x-, y-, z-, and θ-directions to be able to access each cassette of wafers located in the load ports 102 as well as the load lock 200. Such a configuration allows a wafer handling unit 104 to move in the x-direction to a load port 102, to move in the z-direction to the height of a wafer, to move in the y-direction to pick up the wafer, to move in the x-direction to the port 110, to move in the θ-direction such that the arm faces the port 110, to move in the z-direction to the desired load height, and to move in the y-direction to drop off the wafer, although other configurations are also possible. In some embodiments, the wafer handling units 104, 105 may transfer wafers 11 between each other by direct transfer, by way of a stationary workpiece station, or by way of a dummy cassette. It should be understood by one skilled in the art that the loading station 100 may include any number of wafer handling units 104, 105 sufficient to effectively transfer wafers between the cassettes (not shown) on the loading station 100 and the load lock 200.

Figure 7:
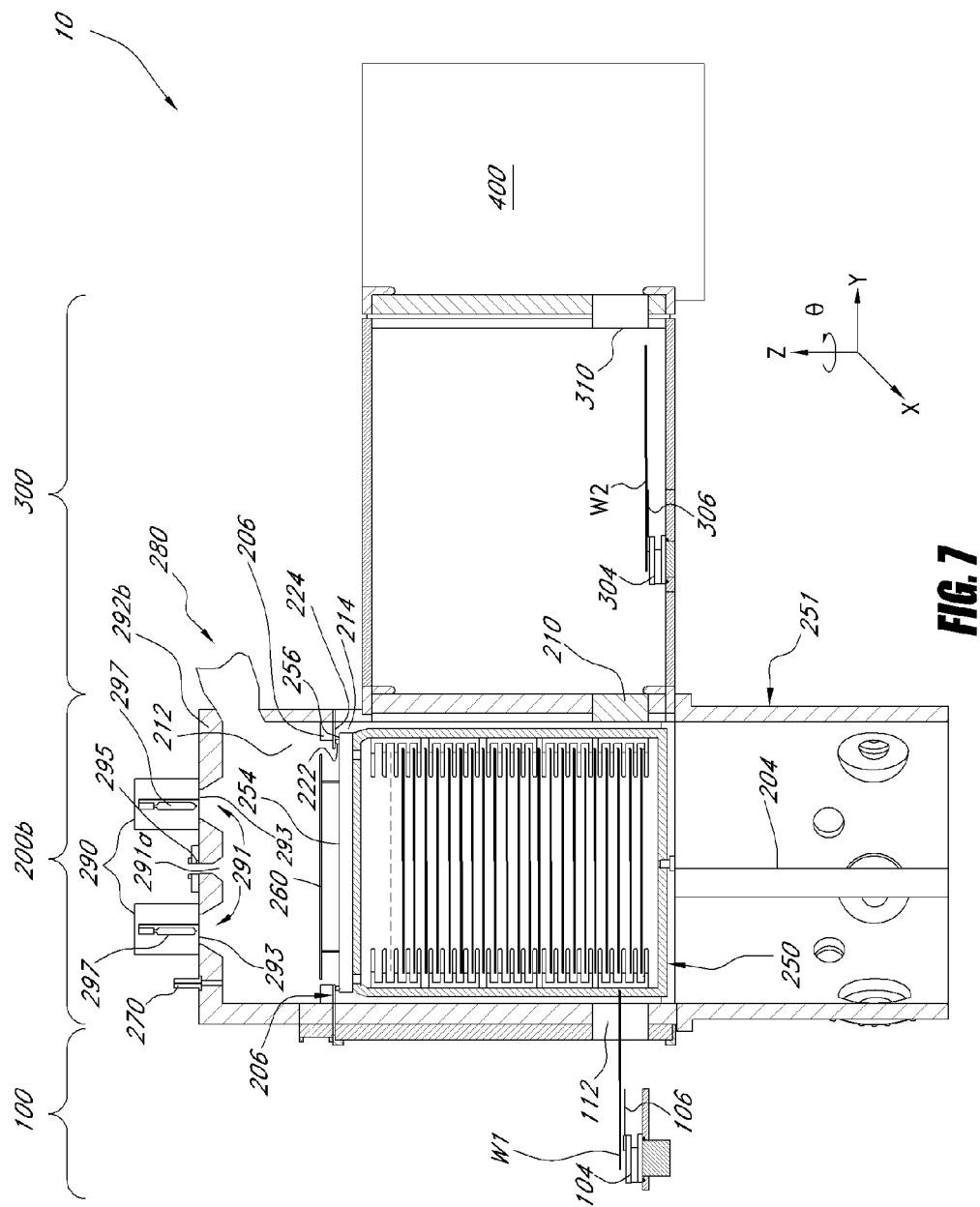
FIG. 7 illustrates an elevational, cross-sectional view of a semiconductor processing apparatus in accordance with the embodiment of FIG. 4.

With reference to FIG. 2, in certain embodiments, the load lock 200 is configured to receive wafers 11 from a wafer handling unit 104 or 105 and includes a chamber 202, a partition 206, an upper port 110, a lower port 112, a first transfer port 210, and a movable boat 250. The partition 206 extends inwardly from the walls of the chamber 202 and separates the chamber 202 into an upper portion 212 and a lower portion 214. The upper portion 212 can form a secondary isolation chamber in which an auxiliary process can be performed on one or more wafers 11. In some embodiments, the upper portion 212 can form a secondary isolation chamber that is fluidly sealable from the lower portion 214. When the upper portion 212 is not sealed from the lower portion 214, the upper and lower portions 212, 214 are in fluid communication therebetween. The ports 110, 112, 210 allow the chamber 202 of the load lock 200 to be isolated from the ambient environment and other portions of the apparatus 10, and the ports 110, 112, 210 also allow the chamber 202 to be evacuated or filled with a gas through other inlets and outlets (not shown), thereby raising or lowering the pressure within the chamber 202 above or below atmospheric pressure. In certain embodiments, each of the ports 110, 112, 210 is formed as a gate valve. In some embodiments, each port 110, 112, 210 is formed as a rotatable door valve. It should be understood by one skilled in the art that any type of valve can be used for the ports 110, 112, 210 to allow the load lock 200 to be substantially sealed from the external environment and other portions of the apparatus 10, and selectively open to allow the passage of a wafer 11 therethrough. It should also be understood by one skilled in the art that the ports 110, 112, 210 can be formed as the same type of valve, or can be formed of any combination of valves therebetween. Further, it will be understood by one skilled in the art that the size of the ports 110, 112, 210 shown in FIGS. 1-2 is for illustrative purposes only. For example, FIG. 7 shows ports 112 and 210 with a height substantially smaller than lower portion 214 and chamber 300, while still sufficiently wide to allow the passage of a wafer 11 therethrough.

The upper portion 212 and the lower portion 214 can be sized and shaped in many different configurations. In some embodiments, the upper portion 212 is sized and shaped to define a smaller interior volume than lower portion 214, e.g., to allow a faster purge of upper portion 212 during an auxiliary process in the upper portion 212. In some embodiments, the upper portion 212 and the lower portion 214 are sized and shaped such that movable boat 250 and/or workpiece support 260 hold various numbers of wafers 11. In an embodiment, the upper portion 212 is sized and shaped to accommodate less than five workpieces, and the lower portion 214 is sized and shaped to accommodate greater than five workpieces. In other embodiments, the upper portion 212 can be sized and shaped to accommodate five or more workpieces, and/or the lower portion 214 can be sized and shaped to accommodate five or less workpieces.

In certain embodiments, the movable boat 250 is disposed within the chamber 202, as shown in FIG. 2. The boat 250 is configured to receive and transport wafers 11 within the chamber 202. In certain embodiments, the boat 250 forms part of a wafer indexer 251 such that the boat 250 is translatable along a substantially vertical axis. The boat 250 includes a plurality of wafer slots with an additional workpiece support 260. In the embodiment illustrated in FIG. 2, the workpiece support 260 is mounted to a top or "upper" surface 254 of the boat 250, which includes a peripheral portion 256. In certain alternative embodiments, the workpiece support 260 is mounted to a bottom or "lower" surface of the boat 250. The workpiece support 260 is configured to receive at least one wafer 11. The wafer indexer 251 includes the boat 250 with a plurality of workpiece support structures 252, and each workpiece support structure 252 defines a slot configured to receive a single wafer 11. In certain embodiments, the wafer indexer 251 is configured to receive between about 5 and 25 wafers 11. In certain embodiments, the wafer indexer 251 is configured to receive at least five wafers 11. In certain embodiments, the wafer indexer 251 is configured to receive at least ten wafers 11. In certain embodiments, the wafer indexer 251 is configured to receive at least twenty wafers 11. In certain embodiments, the wafer indexer 251 is configured to receive at least twenty five wafers 11. In certain embodiments, the wafer indexer 251 is adjustable to receive the number of wafers 11 equal to the number of wafers 11 carried in a cassette (not shown) attached to a load port 102. In certain embodiments, the wafer indexer 251 is adjustable to receive the number of wafers 11 equal to the number of wafers 11 carried in a plurality of cassettes (not shown) attached to the load ports 102. The wafer indexer 251 is configured to receive and hold wafers while at least one wafer is being processed by the semiconductor processing apparatus 10.

While referred to as a "boat" 250 herein, it will be understood that a support or rack with multiple wafer positions or slots can take many forms. In certain embodiments, the boat 250 is formed of quartz. It should be understood by one skilled in the art that the boat 250 may also be formed of silicon carbide, silicon carbide coated quartz, plastic, metal, or any other material suitable for holding wafers 11 at the operating temperatures and pressures of the load lock 200. The boat should also be designed to handle relatively hot wafers, depending on cooling structures and sequences employed in the workpiece handling chamber 300 and process modules 400. In some embodiments, the boat 250 is substantially non-reactive with chemicals or reactants used in the processing chambers 400 and with the fluids within the load lock 200.

The boat 250 forms part of a wafer indexer 251 that vertically aligns wafer positions or slots, formed by the plurality of workpiece support structures 252, with wafer ports for access by the robots. The workpiece support structures 252 are formed as fingers or ledges extending inwardly and are configured to support a wafer 11 therein. In certain embodiments, the boat 250 is configured to hold one or more test wafers such as non-production wafers that are used to test or verify conditions in one or more process modules 400. In other embodiments, the boat 250 is configured to hold one or more wafers that have been or will be subjected to an auxiliary process in upper portion 212.

In certain embodiments, the boat 250 is configured to be translatable in a substantially vertical manner within the chamber 202, as shown in FIG. 2. When receiving at least one wafer 11 from a wafer handling unit 104 through the lower port 112, the boat 250 is translatable to align an empty slot or workpiece support structure 252 with the lower port 112 such that the workpiece handling unit 104 can transfer a wafer 11 into the empty workpiece support structure 252. When unloading wafers 11, the wafer indexer 251 translates the boat 250 to align one of the workpiece support structures 252 carrying a wafer with the lower port 112 to allow the lower workpiece handling unit 105 to remove the wafer 11 from the workpiece support structure 252. In certain embodiments, the wafers 11 are loaded and unloaded through only the lower port 112. In certain embodiments, the wafers 11 are loaded and unloaded through only the upper port 110. In certain embodiments, the wafers 11 are loaded and unloaded through both the upper and lower ports 110, 112. It should be understood by one skilled in the art that the chamber 202 may have dimensions sufficient to allow the boat 250 to translate such that a wafer on the uppermost workpiece support structure 252 may be loaded/unloaded through the lower port 112 and/or such that a wafer on the lowermost workpiece support structure 252 may be loaded/unloaded through the upper port 110.

The boat 250 is adapted to hold wafers 11 within the wafer indexer 251 prior to and after processing of each wafer 11. The wafers 11 are transferred from the load lock 200 through the wafer handling chamber 300 for processing via the first transfer port 210, and the wafers 11 are returned to the load lock 200 through the wafer handling chamber 300 after processing via the first transfer port 210.

In certain embodiments, as explained above, a workpiece support 260 is mounted on an upper surface 254 of the boat 250, as shown in FIG. 2. In certain embodiments, the workpiece support 260 includes a plurality of lift pins or a vacuum chuck (not shown) for receiving and supporting at least one wafer 11. In some embodiments, the workpiece support 260 is configured to hold more than one wafer 11. In some embodiments, the workpiece support 260 is configured to hold five or less wafers 11. In some embodiments, the workpiece support 260 is configured to hold two or less wafers. In certain such embodiments, the multiple wafers 11 on the workpiece support 260 may be accessed through the port 110 by indexing the wafer handling unit 104 in the z-direction. It should be understood by one skilled in the art that the dimensions of the port 110 should be large enough to allow the wafer handling unit 104 to access each of the wafers 11 supported by the workpiece support 260, if more than one wafer 11 is supported by the workpiece support 260 while the boat 250 is in the upper position with the upper and lower portions 212, 214 sealed from one another.

In certain embodiments, the workpiece holder 260 is rigidly attached to the upper surface 254 of the boat 250, as shown in FIG. 2 or the lower surface of the boat 250. In certain embodiments, the workpiece holder 260 is removably connected to the upper surface 254 of the boat 250. The workpiece holder 260 may be replaceable by releasing fasteners, thereby allowing the workpiece holder 260 to be removed for cleaning or repair, or to be removed and replaced by a different workpiece holder 260. For example, a workpiece holder 260 configured to support a single wafer 11 may be removed and replaced with a workpiece holder 260 configured to support a plurality of wafers 11.

The workpiece holder 260 can be formed of many different materials, such as the materials described above for the boat 250. In some embodiments, the workpiece holder 260 may comprise the same or a different material than the boat 250. In some embodiments, the workpiece holder 260 can comprise a material that can perform within the parameters of an auxiliary process conducted within the upper portion 212. For example, the holder 260 may comprise material that is corrosion, temperature, and/or pressure resistant, based on the exposure of the workpiece holder 260 to certain processes within the upper portion 212 and/or the lower portion 214. For example, wafer pre-clean processes are described below.

Figure 4:
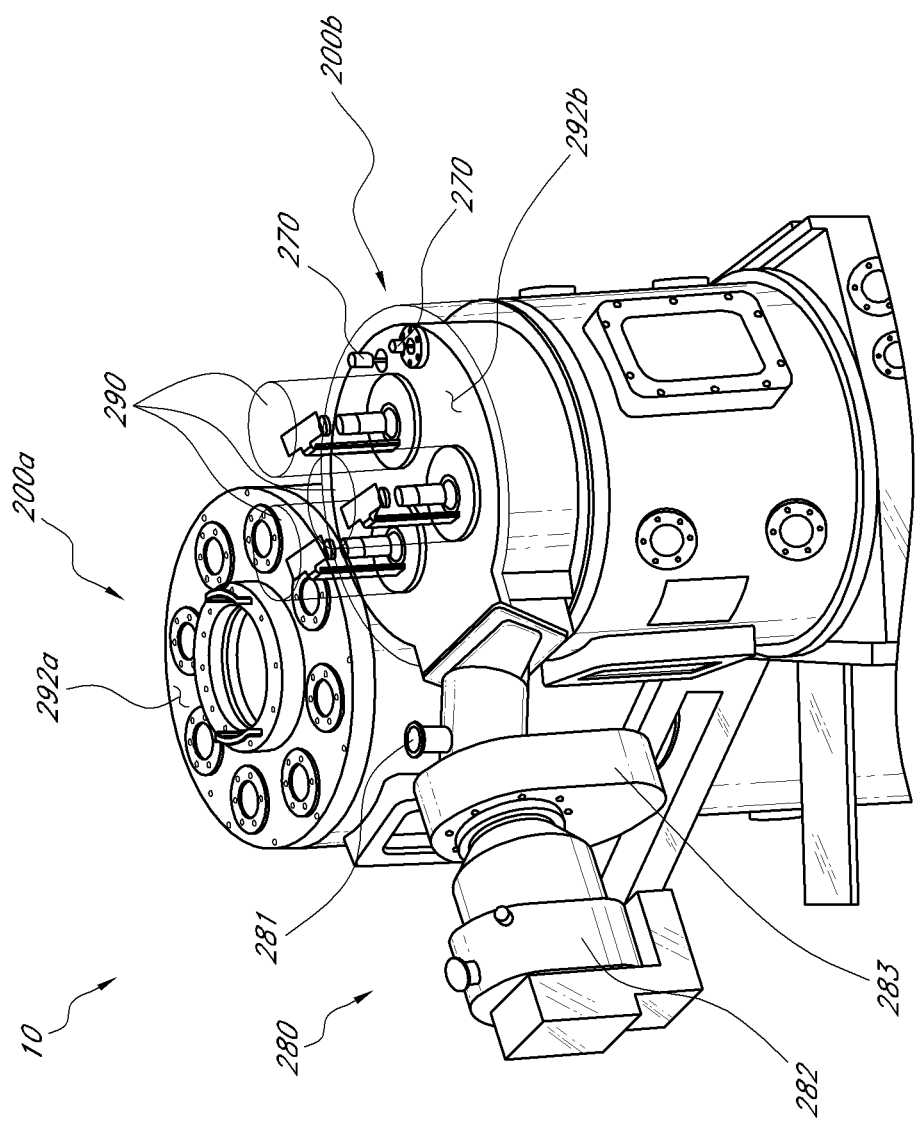
FIG. 4 is an isometric view of a semiconductor processing apparatus comprising a plurality of load locks comprising secondary isolation chambers in accordance with another embodiment.

In certain embodiments, such as the embodiment shown in FIG. 4 and described further herein, the semiconductor processing apparatus 10 can comprise a plurality of load locks 200. An apparatus 10 comprising a plurality of load locks 200 may allow further process flexibility. For example, a first lot of wafers may be unloaded from a first load lock to the wafer handling chamber 300 while a second lot of wafers is loaded into a second load lock from the loading station 100. In some embodiments, the plurality of load locks 200 are each in fluid communication with a single wafer handling chamber 300. In some embodiments, each of the plurality of load locks 200 is connected to a different wafer handling chamber 300.

In certain embodiments, the pressure within the load lock, when sealed from the loading station 100, is between about 1 and 10 Torr (between approximately 0.13 and 1.3 kPa), 3 and 7 Torr (between approximately 0.4 and 0.93 kPa), 4 and 6 Torr (between approximately 0.53 and 0.8 kPa), or about 5 Torr (approximately 0.67 kPa) greater than the ambient pressure, whereby fluid flows from the load lock 200 to the ambient environment when the port 110 or the port 112 is open to substantially reduce any particulate matter from flowing from the ambient environment into the load lock 200.

The wafer handling chamber 300 includes a wafer handling unit 304, as shown in FIGS. 1-2. The wafer handling chamber 300 is in fluid communication with the load lock 200 through the first transfer port 210, and may be isolated from the load lock 200 by closing and sealing the first transfer port 210. The wafer handling unit 304 is configured to transfer wafers 11 between the load lock 200 and one or more process modules 400. In the illustrated embodiment, the wafer handling unit 304 includes an arm 306 that is extendable such that it can pick and place wafers 11. In certain embodiments, the arm 306 is formed as an end effector, for example similar to the arm 206 of the wafer handling unit 104 discussed above. In certain such embodiments, the wafer handling unit 304 includes an air source 320 operatively connected to the arm 306 such that wafers 11 are held securely by the arm 306. The air source 320 provides air flow through the arm 306 to maneuver the wafer 11 without mechanically grasping the wafer 11. In certain embodiments, the extendable arm 306 mechanically grasps the wafer 11 along the edges, the top surface, the bottom surface, or a combination thereof. In some embodiments, the wafer handling unit 304 includes a plurality of arms 306 configured to transport the wafers 11 between the load lock 200 and a process module 400. It should be understood by one skilled in the art that any mechanism capable of transferring wafers between the load lock 200 and a process unit 400 can be used.

In certain embodiments, the arm 306 is movable a sufficient amount such that the wafer handling unit 304 may access each of the workpiece support structures 252 in the boat 250 via the first transfer port 210 without movement of the boat 250 relative to the first transfer port 210. In such embodiments, the dimensions of the first transfer port 210 are sufficient to allow the wafer handling unit 304 to access each workpiece support structure 252 within the boat 250 when the boat 250 remains in a fixed position, in which case wafers access the upper portion 212 from the side of the loading station 100. In other embodiments, the index 251 vertically positions the boat 250 for access by the wafer handling unit 304 to particular slots or wafer support structures, in which case the dimensions of the first transfer port 210 are such that the wafer handling unit 304 can access each workpiece support structure 252 within the boat 250 when the boat 250 is suitably positioned by a boat handler or "elevator" or "push rod" 204 of the wafer index 251.

In certain embodiments, the pressure within the wafer handling chamber 300, when sealed from the load lock 200, is between about 1 and 10 Torr (between approximately 0.13 and 1.3 kPa), 3 and 7 Torr (between approximately 0.4 and 0.93 kPa), 4 and 6 Torr (between approximately 0.53 and 0.8 kPa), or about 5 Torr (approximately 0.67 kPa) less than the pressure within the load lock 200, whereby fluid flows from the load lock 200 to the wafer handling chamber 300 when the transfer port 210 is open to substantially reduce any particulate matter from flowing from the wafer handling chamber 300 into the load lock 200.

In certain embodiments, a second air source 322 is operatively connected to the wafer handling chamber 300 to ensure a constant pressure differential between the wafer handling chamber 300 and the load lock 200 when the first transfer port 210 is open therebetween, as illustrated in FIGS. 1 and 3A. In some embodiments, when a wafer is transferred between the load lock 200 and the wafer handling chamber 300, there is no pressure differential therebetween. Accordingly, there is substantially no air flow between the load lock 200 and the wafer handling chamber 300, thereby reducing any particulate matter from flowing from the load lock 200 into the wafer handling chamber 300 or vice-versa. The wafer handling chamber 300 further includes a second transfer port 310 that fluidly connects the wafer handling chamber 300 with at least one process module 400. It should be understood by one skilled in the art that a pressure differential is not limited to the embodiments described herein. For example, the pressure differential may be due to the flow of a fluid other than air (e.g., inert or purge gas), the pressure differential may be variable, there may be a pressure differential during wafer transfer, and the like.

In the embodiment shown in FIG. 1, the semiconductor processing apparatus 10 includes four process modules 400, and each process module 400 is accessible by the wafer handling unit 304 in the wafer handling chamber 300. As used herein, the term "main process" refers to any process performed in any of the process modules 400, whereas the term "auxiliary process" refers to a process performed in the load lock 200, and in particular, to the upper portion 212 of the loadlock 200. In certain embodiments, each process module 400 performs the same process in semiconductor manufacturing. In certain embodiments, at least one process module 400 performs a different process than the other process modules 400. It should be understood by one skilled in the art that the number of process modules 400 as well as the process that each process module 400 is configured to perform may vary depending on the needs of an operator using the semiconductor processing apparatus 10. For example, and without limitation, a process module 400 may be formed as a chemical vapor deposition (CVD) reactor, a plasma-enhanced CVD reactor (PECVD), an atomic layer deposition (ALD) reactor, a low-pressure CVD reactor (LPCVD), a physical vapor deposition (PVD) reactor, a thermal annealer, or an etch chamber. The illustrated semiconductor processing apparatus 10 is one form of a cluster tool comprising a plurality of process modules 400, which provides high process and tool flexibility. For example, multiple process modules 400 may enable parallel similar processing of a plurality of wafers 11 and/or serial processing of wafers 11 through two or more process modules 400 running different main processes.

Each process module 400 is in fluid communication with the wafer handling chamber 300 through the second transfer port 310, as shown in FIGS. 1-2. In certain embodiments, the second transfer port 310 is formed as a gate valve. In another embodiment, the second transfer port 310 is formed as a rotatable door valve. It should be understood by one skilled in the art that any type of valve can be used for the second transfer port 310 to allow the process module 400 to be substantially sealed from the workpiece handling chamber 300 and to selectively open to allow the passage of the wafer 11 therethrough. In certain embodiments, the pressure within the process module 400 is between about 1 and 10 Torr (between approximately 0.13 and 1.3 kPa), 3 and 7 Torr (between approximately 0.4 and 0.93 kPa), 4 and 6 Torr (between approximately 0.53 and 0.8 kPa), or about 5 Torr (approximately 0.67 kPa) less than the pressure within the wafer handling chamber 300, whereby fluid flows from the wafer handling chamber 300 to the process module 400 when the second transfer port 310 is open to substantially reduce any particulate matter from flowing from the process module 400 into the wafer handling chamber 300. A purge supply (not shown) is operatively connected to the process module 400 to maintain a pressure differential between the process module 400 and the wafer handling chamber 300 to prevent reverse airflow from the wafer handling chamber 300 into the process module when the second transfer port 310 is open. It should be understood by one skilled in the art that a pressure differential is not limited to the embodiments described herein. For example, the pressure differential may be due to the flow of any of a number of fluids, the pressure differential may be variable, there may be a pressure differential during wafer transfer, and the like. The pressure differential may also be formed using a vacuum source instead of an air source. Accordingly, the pressure differential may be formed by configuring fluid or vacuum sources in any of load lock 200 (including upper and lower portions 212, 214), wafer handling chamber 300, and process module 400.

As explained above, the load lock 200 includes a chamber 202 that is sealable into an upper portion 212 and a lower portion 214 when the boat 250 is in the upper, sealed position, as shown in FIG. 2. In the illustrated embodiment, the side walls 220 of the chamber 202 form a substantially cylindrical chamber 202. In certain embodiments, the chamber 202 has a square horizontal cross-section. In certain embodiments, the chamber 202 has a rectangular horizontal cross-section. It should be understood by one skilled in the art that the cross-section of the chamber 202 may be any shape sufficient to house a movable boat 250 therewithin. The partition 206 extends inwardly from the inner surface of the side walls 220 of the chamber 202 to form an annular ledge. The partition 206 defines an opening, indicated by the dotted line 208 (FIG. 1), sized to allow the workpiece holder 260 and a wafer 11 thereon to pass therethrough.

In certain embodiments, a seal 222 extends from the lower or upper surface of the partition 206. In certain embodiments, the seal 222 is operatively connected to the partition 206. For example, in the illustrated embodiment, the seal 222 extends from a lower surface 224 of the partition 206. In certain embodiments, the seal 222 is integrally formed with said partition 206 as a single member. In certain embodiments, the seal 222 can comprise a first seal that is operatively connected to the partition 206 and a second seal that is operatively connected to the boat 250. In certain embodiments, the seal 222 is an O-ring. The seal 222 may be formed of an elastomer such as viton. It should be understood by one skilled in the art that the seal 222 can be formed of any material or may be disposed in any configuration sufficient to provide a substantially air-tight seal between the upper and lower portions 212, 214 of the chamber 202 when the boat 250 is located in the sealed position, which occurs when the peripheral upper surface 256 of the boat 250 contacts the seal 222. The peripheral upper surface 256 of the boat 250 is substantially solid and continuous to provide sufficient contact with the seal 222 to form a seal between boat 250 and a surface of partition 206, e.g., lower surface 224, such that upper portion 212 can be sealed from lower portion 224. One skilled in the art should also understand that seal 222 can also comprise any materials that provides a seal while performing within the parameters of an auxiliary process conducted within the upper portion 212. For example, seal 222 may comprise material that is corrosion, temperature, and/or pressure resistant, based on the exposure of seal 222 to processes within the upper portion 212 and/or lower portion 214. Other sealing mechanisms (e.g., labyrinth seal) will be recognized by the skilled artisan.

When the boat 250 is in the sealed position, the upper portion 212 of the chamber 202 can only pass wafers through the upper port 110 (when open), and the lower portion 214 of the chamber 202 can only pass wafers through the lower port 112 and/or the first transfer port 210 (when open). Additionally, when the boat 250 is in the sealed position, the upper portion 212 forms a secondary isolation chamber within the load lock 200 in which the pressure within the upper portion 212 can be independently adjusted without affecting the pressure within the lower portion 214, and accordingly can have gas inlets and outlets.

In certain embodiments, the boat 250 is configured to reside and translate within the lower portion 214 of the chamber 202, as shown in FIG. 2. While the illustrated embodiment shows the lower portion 214 of the chamber 202 to be larger than the upper portion 212 of the chamber 202 and the boat 250 translating within the lower portion 214, it should be understood by one skilled in the art that the design can be reversed such that the upper potion 212 is larger than the lower portion 214 and the boat 250 translates within the upper portion 212. It should further be understood by one skilled in the art that the load lock 200 may be substantially laterally oriented such that the wafers 11 are loaded from the top and the boat 250 translates within the chamber 202 in a substantially lateral manner.

The boat 250 is translatable within the chamber 202 of the load lock 200, and the boat 250 is controlled by the boat handler 204, as shown in FIG. 2. In certain embodiments, the boat handler 204 includes a piston 205 that is operatively attached to the boat 250. Movement of the piston 205 causes the boat 250 to move within the chamber 202 accordingly. In certain embodiments, the piston 205 is controlled by a hydraulic motor (not shown). In another embodiment, the piston 205 is controlled by a screw gear (not shown). It should be understood by one skilled in the art that the movement of the boat 250 within the load lock 200 can be controlled by any actuator sufficient to allow the boat 250 to translate in a substantially linear manner between a non-sealed position and a sealed position. In certain embodiments, the boat handler 204 is configured to index or position the boat 250 such that wafers 11 may be passed into and removed from the workpiece support structures 252 through one or more of the ports 110, 112, 210.

In embodiments in which the boat 250 is configured to translate in a substantially vertical manner within the chamber 202 and in which the workpiece holder 260 is mechanically coupled to the upper surface 254 of the boat 250, the upwardmost limit of travel of the boat 250 is limited at the sealed position, as shown in FIG. 2. The boat 250 may be moved away from the partition 206 by a particular maximum distance, which may be a pre-defined distance or the limit of the stroke of the piston 205 of the boat handler 204. When the boat 250 is in the sealed position, the upper surface 254 of the boat 250 contacts the partition 206, thereby sealingly isolating the upper portion 212 of the chamber 202 from the lower portion 214 of the chamber 202 and creating a secondary isolation chamber. Because the workpiece holder 260 is mechanically coupled to the upper surface 254 of the boat 250, when the boat 250 is moved by the boat handler 204, the workpiece holder 260 moves in a corresponding manner. When the boat 250 is moved into the sealed position, the workpiece holder 260 extends through the opening 208 in the partition 206 such that the wafer 11 or wafers supported on the workpiece holder 260 extend above the partition 206 and are accessible through the upper port 110. It should be appreciated that in embodiments with the inverse arrangement in which the boat is configured to translate in a substantially vertical manner within the chamber and in which the workpiece holder is mechanically coupled to the lower surface of the boat, the lowermost limit of travel of the boat is limited at the sealed position, and the above discussions of "upper" and "lower" would be reversed.

The partition 206 is formed of a material that is sufficiently rigid that it does not substantially deform when the boat 250 applies a pressure to the partition 206 when the boat 250 is in the sealed position. It should be appreciated by those of skill in the art that the rigidity of a material depends on its dimensions and composition. One skilled in the art should also understand that partition 206 can also comprise any materials that maintain this rigidity while performing within the parameters of an auxiliary process conducted within the upper portion 212 and/or lower portion 214. For example, boat 250 may comprise material that is corrosion, temperature, and/or pressure resistant, based on the exposure of partition 206 to processes within upper portion 212.

When the upper portion 212 and the lower portion 214 of the chamber 202 are fluidly isolated, they may each be adjusted to have different pressures therein. As such, the pressure in the upper portion 212 may be increased or decreased, without affecting the pressure in the lower portion 214. In certain embodiments, the upper portion 212 is only a portion of the chamber 202, so evacuation or backfilling only the upper portion 212 does not take as much time as evacuation or backfilling of the entire chamber 202. Moreover, opening the upper portion 212 to the ambient environment does not expose the lower portion 214 to the atmospheric air or particulates from the ambient environment. Sealing the upper portion 212 of the chamber 202 from the lower portion of the chamber also allows external access through the upper port 110 to the workpiece holder 260 without exposing the remaining wafers 11 located within the wafer indexer 251 in the lower portion 214 to the ambient environment when the upper portion 212 is opened to the ambient environment. Thus, the load lock 200 is configured to allow a robot, such as the upper wafer handling unit 104, to access at least one wafer 11 supported by the workpiece holder 260 without substantially decreasing throughput resulting from changing the pressure within the entire load lock 200 in order to allow access or removal of a single wafer located disposed within the wafer indexer 251. Moreover, the first transfer port 210 may be opened, thereby exposing the lower portion 214 to the wafer handling station 300, without affecting the pressure in the upper portion 212. When the upper portion 212 and the lower portion 214 are in fluid communication when the boat 250 is not in the sealed position, the upper portion 212 and the lower portion 214 have the same pressure therebetween.

An auxiliary process performed within upper portion 212 can be many different types. In certain embodiments, the upper portion 212 of the chamber 202 includes a metrology apparatus 270 configured to measure a parameter of a wafer 11 disposed on the workpiece holder 260, as shown in FIG. 2. It should be understood by one skilled in the art that the metrology apparatus 270 can be any device configured to measure at least one aspect of a wafer 11. In certain embodiments, the metrology apparatus 270 is an ellipsometer configured to measure the thickness of a layer on a wafer 11 that has been processed in the semiconductor processing apparatus 10. In certain embodiments, the metrology apparatus 270 is a particle counter configured to measure a level of contamination of a wafer 11 that has been processed in the semiconductor processing apparatus 10. In certain embodiments, the metrology apparatus 270 is operatively connected to a control device (not shown) containing control logic for controlling the process for fabricating semiconductor wafers, wherein the metrology apparatus provides feedback to the control device to allow the control device to adjust the fabricating process in the process modules 400 for subsequently processed wafers 11. In certain embodiments, a wafer 11 supported by the workpiece holder 260 is measured within the upper portion 212 by the metrology apparatus 270 when the boat 250 is in the sealed position. Measuring at least one aspect of a processed wafer 11 can allow the semiconductor processing apparatus 10 to validate or verify the process performed by the semiconductor processing apparatus 10 while continuously and/or simultaneously processing the rest of the wafers 11 in the lot or batch.

Performing metrology on a processed wafer 11 within the load lock 200 of the semiconductor processing apparatus 10 or "in situ" can save time typically used to transport the processed wafer 11 to be measured to a separate metrology tool external from the semiconductor processing apparatus 10. Moreover, a direct electronic feedback loop from the metrology apparatus 270 may be used to alter the process parameters of the process module 400 or to shut down the semiconductor processing apparatus 10 down if the results of the measurements advise such action. Providing feedback from the metrology apparatus 270 may provide an indication of problems with other portions of the semiconductor processing apparatus 10 or even an indication of problems with other semiconductor processing apparatuses. Accordingly, corrections to the fabrication processes can be made before subsequent wafers 11 are processed. For example, if the metrology apparatus 270 is an ellipsometer that measures the thickness of a layer of material being deposited on a wafer 11 in the process module 400 as being too thick, too thin, or uneven, or certain process parameters can be adjusted such that the remaining wafers to be processed in the same process module 400 do not receive a deposition that is too thick, too thin, or uneven. For another example, if the metrology apparatus 270 is a particle counter that indicates that the process module 400 is creating films of material on the surface of the wafer 11 with too many particles, the process module 400 may be shut down for cleaning prior to contaminating the remaining wafers 11 in the lot. In certain embodiments in which the semiconductor processing apparatus 10 includes multiple process modules 400, wafers 11 may be directed away from the process module 400 that is depositing a layer of material that is too thick or that is depositing too many particles to another of the process modules 400 that is not depositing layers that are too thick or producing contaminated wafers. In certain embodiments, a wafer 11 is removed from the upper portion 212 of the chamber 202 by the wafer handling unit 104 and is transferred to a separate metrology tool external of the semiconductor processing apparatus 10 for measurements or testing without significantly reducing the throughput of the semiconductor processing apparatus 10.

In certain embodiments, the process modules 400 continue to process wafers 11 during and after a processed wafer 11 is measured or tested by the metrology apparatus 270 until process conditions are changed, based on the results of the metrology apparatus 270, or until the entire lot or supply of wafers 11 has been processed. In certain embodiments, the process module 400 is shut down until the results of the metrology apparatus 270 testing at least one wafer 11 are obtained. In certain embodiments, a particular wafer 11 or a test wafer is subject to a different process than the rest of the wafers 11 in the lot. The test wafer can be removed from the load lock 200 for further processing or testing without disturbing the rest of the wafers 11 in the load lock 200.

FIGS. 3A-3E illustrate an example method of processing wafers 11 in the semiconductor processing apparatus 10. FIG. 3A illustrates a plurality of wafers 11 being loaded into the boat 250 by the lower wafer handling unit 105. The lower port 112 is open such that the wafer handling unit 105 passes each wafer 11 to be loaded therethrough. The boat handler 204 may move the boat 250 between a plurality of positions during loading of the wafers 11 such that the desired workpiece support structure 252 is positioned to have a wafer 11 inserted thereon. The skilled artisan will appreciate that, in view of such indexing, the lower port 112 can be significantly smaller than illustrated. When the desired number of wafers 11 has been loaded into the boat 250, the lower port 112 is closed and the air from the ambient environment is evacuated from the chamber 202. In certain embodiments, the chamber 202 remains at a reduced pressure after evacuation. In certain embodiments, the chamber 202 is backfilled with a gas such as nitrogen or a noble gas.

Figure 3B:
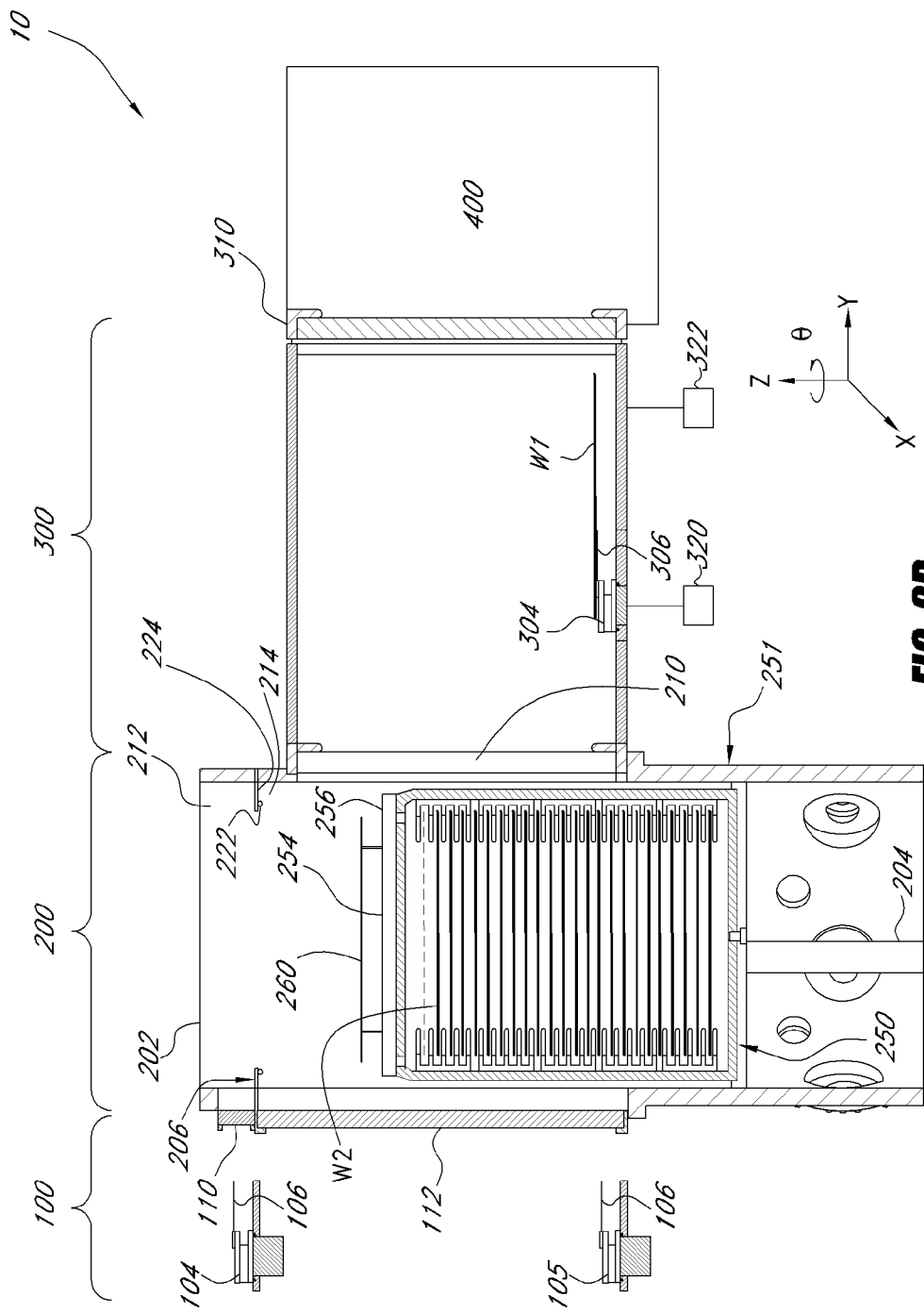

As shown in FIG. 3B, once the desired number of wafers 11 has been transferred into the boat 250, the first transfer port 210 is opened such that the wafer handling unit 304 may extract a wafer W1 from the boat 250. The boat handler 204 may move the boat 250 between a plurality of positions during unloading of the wafers 11 such that the desired workpiece support structure 252 is positioned to have a wafer W1 removed therefrom. The skilled artisan will appreciate that, in view of such indexing, the first transfer port 210 can be smaller than illustrated. The dotted line in FIG. 3B shows where the wafer W1 removed by the wafer handling unit 304 was located within the boat 250 prior to extraction by the wafer handling unit 304. In certain embodiments, the boat handler 204 causes the boat 250 to be moved within the load lock 200 such that the wafer handling unit 304 may place the wafer W1 on the workpiece holder 260 without having been processed.

In another embodiment, the first transfer port 210 is closed such that the wafer handling unit 304 can transfer the wafer W1 removed from the boat 250 into a process module 400 for processing without exposing the load lock 200 to the process module 400. When transferring the wafer W1 from the wafer handling chamber 300 to a process module 400, the second transfer port 310 is opened between the wafer handling chamber 300 and the process module 400. Once the wafer W1 has been transferred from the wafer handling chamber 300 to one of the process modules 400, the second transfer port 310 is closed and the wafer W1 is processed within the process module 400.

Figure 3C:
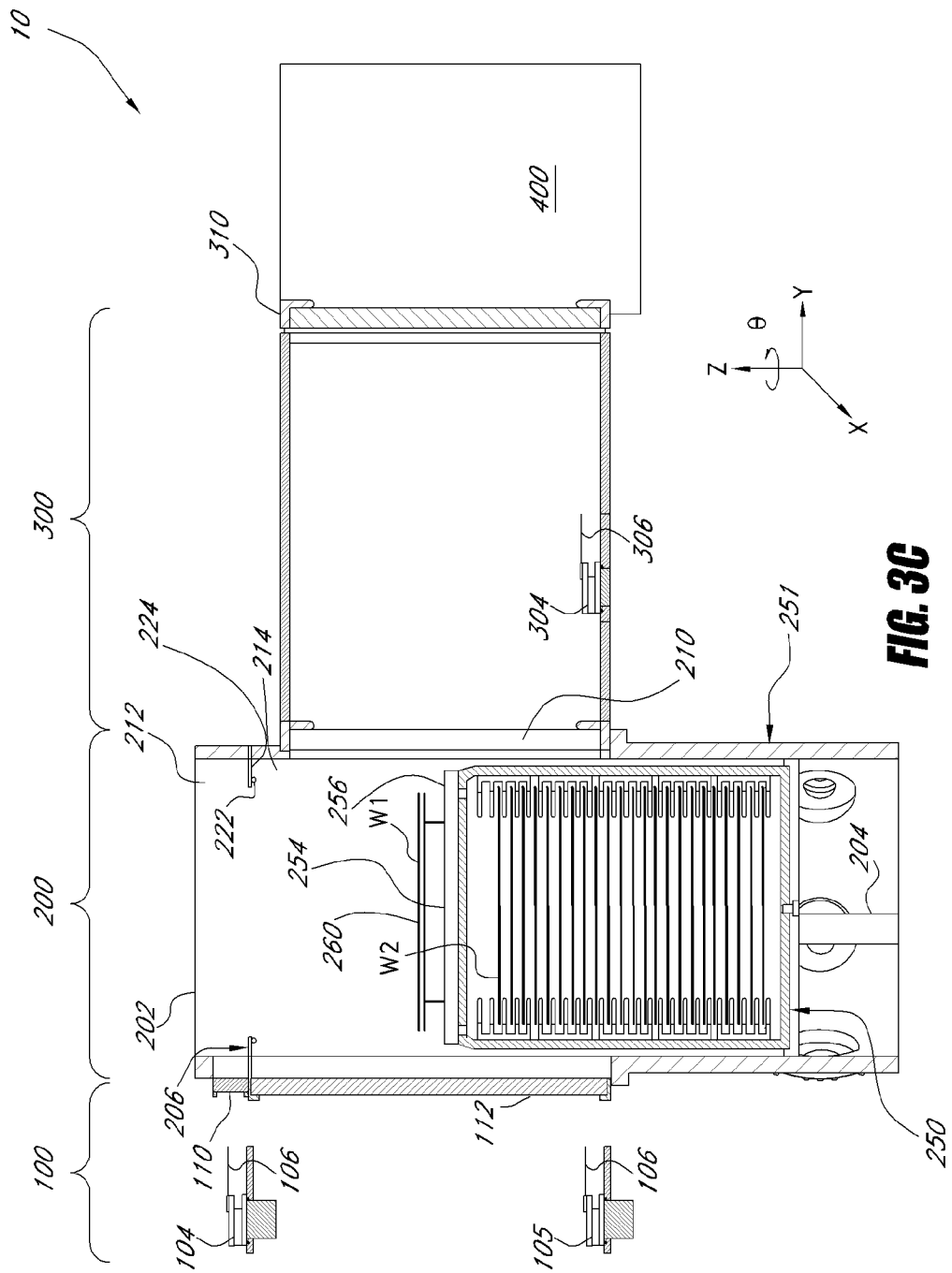

After processing the wafer W1 in the process module 400, the second transfer port 310 is opened and the wafer handling unit 304 removes the wafer W1 from the process module 400. Once the wafer handling unit 304 removes the wafer W1 from the process module 400, the wafer handling unit 304 may transfer the wafer W1 into another of the process modules 400. Alternatively, the processed wafer W1 may be placed back into the location within the workpiece support structure 252 within the boat 250 from where the processed wafer W1 was originally removed, into a workpiece support structure 252 within the boat 250 at a different position than where the processed wafer W1 was removed, or, as illustrated in FIG. 3C, onto the workpiece holder 260.

FIG. 3D illustrates the boat 250 in the sealed position, wherein the peripheral portion 256 of the upper surface 254 of the boat 250 sealably engages the seal 222 extending from the partition 206. As the boat handling unit 204 translates the boat 250 upward, the wafer W1 and the workpiece holder 260 pass through the opening 208 in the partition 206. As described above, when the boat 250 is in the sealed position, the upper portion 212 of the chamber 202 is fluidly isolated from the lower portion 214 of the chamber 202, thereby forming a separated, secondary isolated chamber within the load lock 200. Thus, the upper port 110 may be opened to extract the wafer W1 without disturbing the other wafers 11 disposed within the boat 250. In embodiments in which the dimensions of the first transfer port 210 and the lower port 112 are large enough that the boat 250 can remain in the sealed position, the first transfer port 210 may be opened such that the wafer handling unit 304 may extract another wafer W2 for processing in a process module 400 without disturbing the wafer W1 supported by the workpiece holder 260 in the upper portion 212 of the chamber 202. Moreover, the lower port 112 may be opened to insert or remove wafers 11 from the boat 250 in the lower portion 214 of the chamber 202 without disturbing the wafer W1 supported by the workpiece holder 260 in the upper portion 212 of the chamber 202.

Figure 3E:
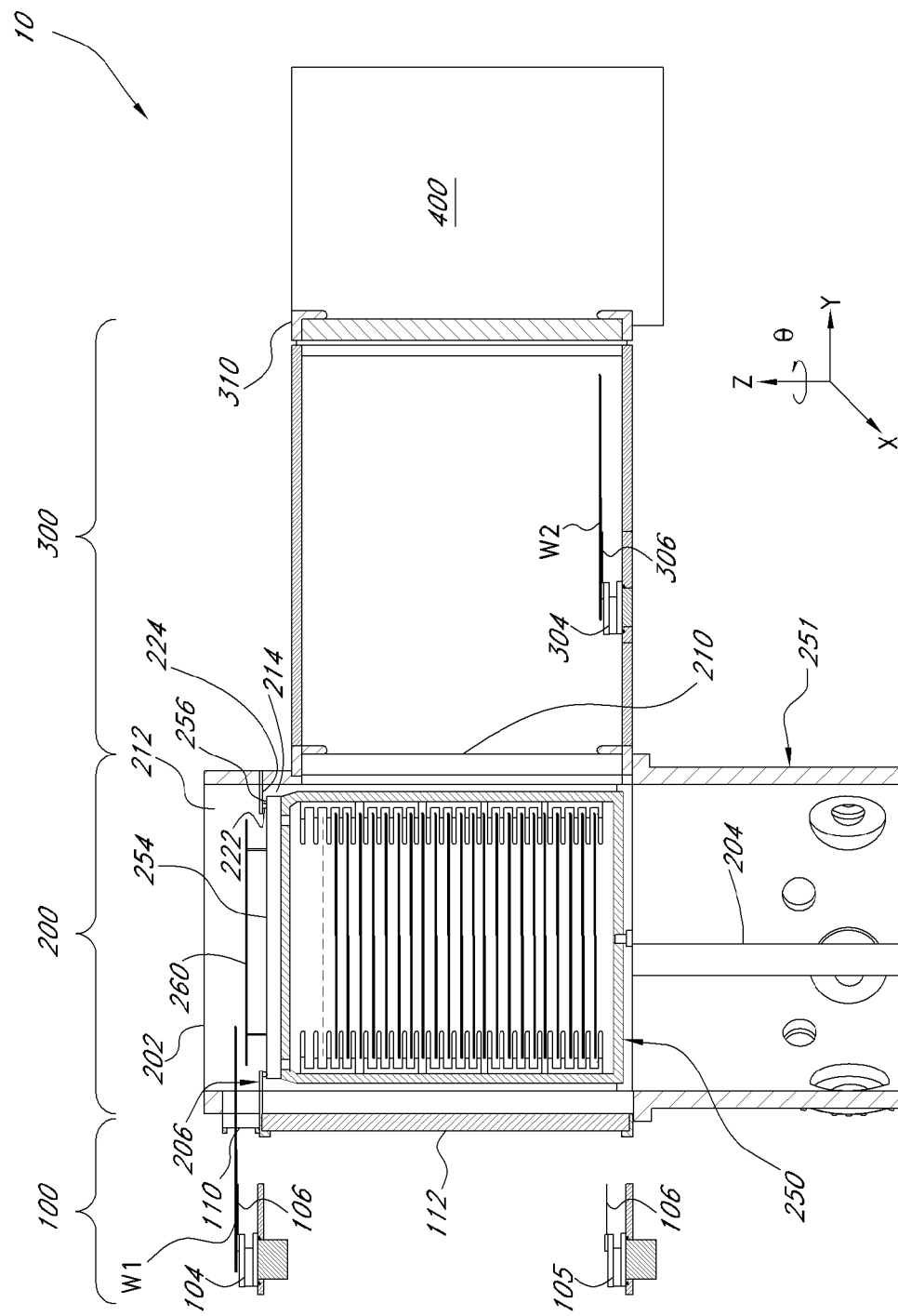

FIG. 3E illustrates an embodiment in which the upper port 110 has been opened such that the upper wafer handling unit 104 may remove the wafer W1 from the workpiece holder 260. FIG. 3E also illustrates that the wafer handling unit 304 has removed another wafer W2 from the boat 250, as indicated by the dotted line in the boat 250 where the wafer W2 was previously located. It should be understood by one skilled in the art that because the upper portion 212 and the lower portion 214 of the chamber 202 are fluidly isolated, the pressure within each portion 212, 214 may be different from each other. Additionally, there may be a pressure differential between the upper portion 212 and the ambient environment of the loading station 100 when the upper port 110 is open that is different than the pressure differential between the lower portion 214 and the ambient environment of the loading station when the lower port 112 is open or between the lower portion 214 and the workpiece handling chamber 300 when the first transfer port 210 is open. The extraction of the wafer W2 by the wafer handling unit 304 can be performed while the lower portion 214 of the chamber 202 is at a reduced pressure or backfilled by a gas.

In certain embodiments, the wafer disposed on the workpiece holder 260 is an experimental wafer. In other words, the wafer is not necessarily associated with the lot of wafers 11 remaining in the boat 250. For example, the wafer W1 located on the workpiece holder 260 may be exposed to an experimental series of fabrication steps, and desirably proceeds through a series of fabrication processes more quickly that the other wafers 11. In the illustrated semiconductor processing apparatus 10, an experimental wafer can be processed in the process module 400 and removed from the semiconductor processing apparatus 10 immediately thereafter such that it can move on to the next stage of processing without having to wait for the rest of the wafers 11 to finish processing in the processing module 400.

In certain embodiments, the wafer disposed on the workpiece holder 260 is a test wafer used to qualify a first process in one or more process modules 400 while the lot of wafers 11 remaining in the boat 250 are to undergo a second process different from the first process in the process modules 400. For example, there may be a number of lots waiting to undergo the first process performed on the test wafer, but the semiconductor processing apparatus 10 is desirably not shut down for qualification of the first process and the semiconductor processing apparatus 10 may advantageously proceed with processing the remaining wafers 11 in the boat 250 with the second process. In the illustrated semiconductor processing apparatus 10, the wafer supported by the workpiece holder 260 can be processed in the process module 400 and removed from the semiconductor processing apparatus 10 immediately thereafter such that it can be measured or tested by the metrology apparatus 270, an external metrology apparatus (not shown), or some other such qualification tool or tools without having to wait for the wafers 11 remaining in the boat 250 to finish processing in the processing module 400.

In certain embodiments, the wafer W1 supported by the workpiece holder 260 is measured by a metrology apparatus 270 while the wafer W1 is located in the upper portion 212 of the chamber 202. In another embodiment, the upper portion 212 merely serves as a separate pathway for the wafer while the first transfer port is open and processing continues, in which case the wafer W1 supported by the workpiece holder 260 can be measured by a separate metrology tool (FIG. 2) after removal from the load lock 200 by a wafer handling unit 104. The results of such testing or measurement may be used to automatically or manually modify the parameters of the process module 400. Alternatively, the wafer W1 can move on to subsequent processing without metrology, again without disturbing processing of the remaining batch of wafers already loaded into the load lock 200.

Because testing or measuring a wafer W1 by a metrology apparatus 270 within the semiconductor processing apparatus 10 and/or removal through the upper port 110 does not require the transferring of wafers 11 from the load lock 200 to a process module 400 to be halted, the load lock 200 comprising a secondary isolation chamber allows potentially valuable feedback data and measurements of a processed wafer to be taken without reducing the throughput of wafer processing by the semiconductor processing apparatus 10.

FIG. 4 illustrates a side isometric view of a semiconductor processing apparatus 10 comprising a plurality of loadlocks 200a, 200b. Configuring the apparatus 10 with a plurality of load locks 200 allows further process flexibility. In some embodiments, a first lot of wafers may be unloaded and/or loaded from one of load locks 200a, 200b to a wafer handling chamber 300 (see, e.g. FIGS. 1-3E, 7) while a second lot of wafers is loaded and/or unloaded into the other of load locks 200a, 200b from a loading station 100. In some embodiments, a first and second lot of wafers can be simultaneously loaded and/or unloaded from both load locks 200a, 200b to either or both of loading station 100 and wafer handling chamber 300. In some embodiments, the load locks 200a, 200b can be in fluid communication with a single wafer handling chamber 300. In other embodiments, each of the plurality of load locks 200 can be connected to a different wafer handling chamber 300.

In some embodiments, one of load locks 200a, 200b can comprise a conventional configuration, wherein the other of load locks 200a, 200b can include the isolatable upper portion 212 described herein. In other embodiments, both load locks 200a, 200b can function similarly to the embodiments described herein. For example, in some embodiments, first and second load locks 200a, 200b may each comprise an upper and lower portion 210, 212, configured to be sealed from each other and to perform one or more auxiliary processes. In some embodiments, the auxiliary processes performed in each load lock 200a, 200b can be the same, to increase throughput through apparatus 10; or can be different, for example, to perform a pre-processing and post-processing auxiliary process, or to perform two different processes such as a cleaning process and a measurement process. In the illustrated exemplary embodiment, the first load lock 200a is a conventional load lock, and the second load lock 200b is configured to clean and/or etch a semiconductor wafer, as will be described presently.

Figure 5:
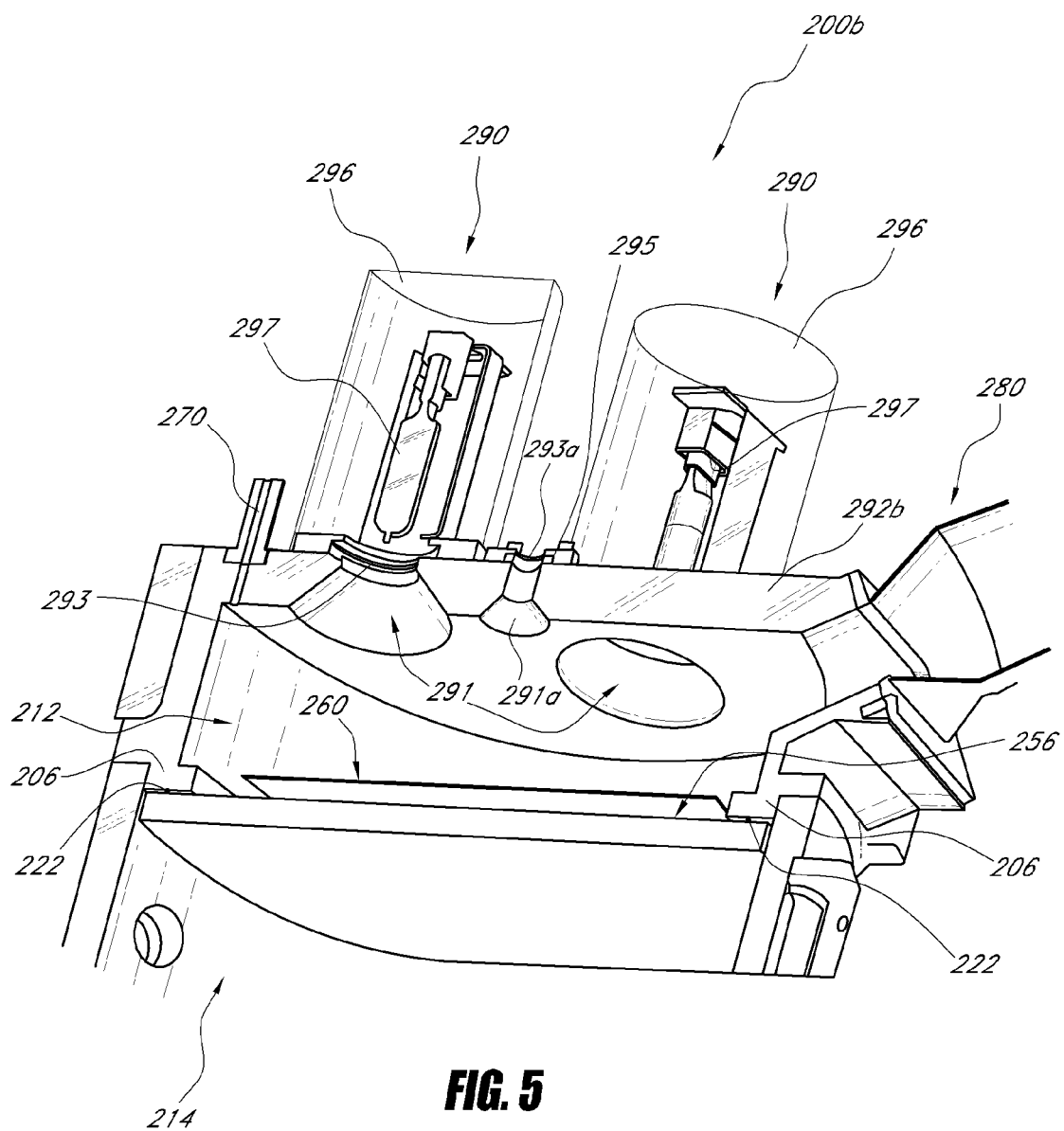
FIG. 5 illustrates a cut-away, isometric view of a load lock from FIG. 4.

FIG. 5 illustrates a partial isometric view of a sectioned load lock 200b from FIG. 4. The load lock 200b illustrates another embodiment of load lock 200 described herein and shown in FIGS. 1-3E. Wafers can be moved to and from the load lock 200b similarly to the embodiments described above with respect to FIGS. 1-3E. Components in this embodiment that are substantially similar to components of the load lock 200 shown in FIGS. 1-3E have been given the same reference number. The load lock 200b can be configured to perform an auxiliary cleaning and/or etching process on wafer W1 in the upper portion 212. In some embodiments, the load lock 200b can perform a pre-cleaning process on a wafer W1 in the upper portion 212 (i.e., before processing the wafer in one of the chambers 400), and in others, a post-cleaning process (i.e., after processing the wafer in one of the chambers 400). In some embodiments, the load lock 200b can perform cleaning and/or etching on wafer W1 as an intermediate step between two or more processes performed in one or more chambers 400 of the cluster tool.

The load lock 200b can comprise an inlet port 270 to introduce one or more cleaning and/or etching fluids into the upper portion 212. In some embodiments, two or more fluids can be pre-mixed prior to introduction into the upper portion 212. In some embodiments, the upper portion 212 can comprise two or more inlet ports 270 (see FIGS. 4, 6) to improve distribution of process fluids within the upper portion 212 and/or allow the process fluids to remain separate prior to their introduction into the upper portion 212 (such as when the process fluids react adversely when mixed in a restrictive piping system, i.e., an exothermic or explosive reaction). The inlet ports 270 can comprise many conventional wafer processing components well known in the art, and can be in fluid communication with valves, gas panels and the like (not shown) for controlling the flow of fluid into the upper portion 212. A skilled artisan will understand that the inlet ports 270 are shown in FIGS. 4-7 on the top side of the upper portion 212 for exemplary purposes only, and can be configured to introduce fluid into the load lock 200b from many different directions.

Referring to FIGS. 4-7, the illustrated load lock 200b comprises an exhaust system 280 in fluid communication with the upper portion 212 and configured to exhaust fluids therefrom. In some embodiments, the exhaust system 280 can exhaust the fluids introduced into the load lock 200b from the inlet port(s) 270 as described above. As used herein, "exhaust fluids" can refer to the evacuation of gases, vapors, liquids, plasma, and the like from the load lock 200b, such as with a vacuum system, or can refer to the removal of such fluids from the load lock 200b while simultaneously introducing fluids into the load lock 200b in a through-flow process. While the illustrated embodiment provides inlet(s) and exhaust(s) to the upper portion 212, as previously noted, the apparatus can be inverted such that auxiliary processing is instead performed in an isolatable lower portion.

The exhaust system 280 can exhaust the load lock 200b in any of a variety of ways known in the art, such as with a vacuum pump integrated with the system 10, or a vacuum pump or facilities vacuum connection separate from the system 10. In a preferred embodiment, the exhaust system 280 comprises one or more flow paths to exhaust the load lock 200b. In a further preferred embodiment, the exhaust system 280 comprises a first flow path through a bypass connection 281, configured to exhaust the load lock 200b with a downstream vacuum pump (not shown), and a second flow path, comprising a vacuum pump 282 integrated with the load lock 200b. As such, the bypass connection 281 and the vacuum pump 282 can provide two separate paths for exhausting the load lock 200. In a further preferred embodiment, the bypass connection 281 and vacuum pump 282 can be configured to remove gases from the upper portion 212 when it is sealed from the lower portion 210. Because chemical processing can take place in the upper portion 212 when sealed, the exhaust might be "dirty" with process gases at times, whereas when unsealed the environment of the load lock 212b should be "clean" purge gas. As used herein, "clean" exhaust refers to the evacuation or removal of substantially inert fluids, such as argon, helium, nitrogen, or other purge gases, and "dirty" refers to the evacuation or removal of gases that can include substantially reactive fluids, such as hydrogen gases, hydrogen chloride, hydrogen fluoride, or other corrosive or reactive fluids and reaction byproducts. Providing paths for clean and potentially dirty vapors reduces the maintenance costs of a scrubber system (not shown) configured downstream of the exhaust system 280. A scrubber system can be used, as known in the art, to clean the dirty process gases evacuated from the load lock 200b.

The exhaust system 280 can comprise a valve 283 to selectively control the flow of fluid from the load lock 200b through the pump 282 and/or the bypass connection 281. "Selectively control" as used herein means the valve 283 can restrict, prevent, or allow flow through the pump 282 in any combination while restricting, preventing, or allowing flow through the bypass connection 281. The valve 283 can comprise any of various different types of conventional process valves known in the art of semiconductor processing, such as an air or solenoid-operated vacuum valve. In a preferred embodiment, the valve 283 comprises an isolation pendulum valve.

In some embodiments, the load lock 200b can comprise one or more heaters 290 to control the temperature of various components and/or process chemicals (such as the reactants or purge gases) within the load lock 200b. The heaters 290 can be used to heat the wafer W1, i.e., to degas the wafer W1 prior to CVD/PVD processing in one of the process modules 400, or to provide a smoother and more uniform surface during the processing of wafer W1 in the load lock 200 and/or process module 400. In a preferred embodiment, the heaters 290 can heat the process fluid within the upper portion 212, to increase the reactivity and etch rate of the cleaning process.

The heaters 290 can comprise any of a variety of conventional heaters used in semiconductor processing, such as microwave, RF, conduction, ultraviolet, or visible spectrum heaters. The type and number of heaters 290 used in the load lock 200b will depend on the auxiliary process used in the upper portion 212. For example, ultraviolet lamps may be preferred where oxygen is admitted into the upper portion 212 to produce ozone. In the illustrated embodiment, the heaters 290 comprise infrared heaters with a heating element 297 and reflectors 296, as known in the art, configured to direct a spectrum of light, including a high proportion of IR light, into the upper portion 212. Infrared heaters may be used to minimize the creation of charged species on the wafers, as is known in the art. Without limitation, an example of a heater that can be used for heater 290 is disclosed in U.S. Pat. No. 4,836,138.

The heaters 290 can be oriented at various angles and positions relative to the components of load lock 200b. In a preferred embodiment, the heaters 290 are provided external to the upper portion 212. In a further preferred embodiment, the heaters 290 are directed approximately orthogonally to the wafer surface in the upper portion 212. The heaters 290 are configured to direct energy into the upper portion 212 through openings 291 extending through a cap portion 292b on the top of load lock 200b. The windows 293 can be provided within the openings 291 to allow light emission through the cap portion 292b, while isolating the heaters 290 from the process fluids within the upper portion 212. The windows 293 can comprise any material that sufficiently allows the transmission of the wavelengths emitted from the heaters 290, while being resistant to the process fluids within the upper portion 212. In some embodiments, the windows 293 can comprise borosilicate glass or quartz. In a preferred embodiment, the windows 293 comprise sapphire, to allow high transmission of infrared wavelengths, while providing resistance to corrosive cleaning fluids, such as HF vapors, within upper portion 212. Using sapphire as a material for the windows 293 can reduce the etching that may occur on the windows 293 during the cleaning/etch process in the load lock 200b, reducing the maintenance costs thereof.

A skilled artisan will understand that the materials of the heaters 290 and other components of the load lock 200b can be adapted to the auxiliary processes used therein. For example, in some embodiments, the materials of various components within the heaters 290 and other components of the load lock 200b can be selected from materials known in the art to provide improved transmission and distribution of heat within the load lock 200b, or to provide varying levels of heat, temperature, and chemical resistance. For example, various reflective materials, such as gold plating, can be used within the components to increase the heat transmission therein. The reflectors 296 are provided with a reflective, and in some embodiments, concave, inner surface to increase the transmission of heat directed through the windows 293. In other embodiments, the inner surfaces of the upper portion 212, the upper surface 256 of the boat 250, the partition 206, and/or the support structure 260 can comprise reflective, chemical, or temperature-resistant materials to improve the processes within the upper portion 212 and increase the operational life of the load lock 200b.

The load lock 200b can comprise one or more temperature sensors 295 to provide feedback to a control system (not shown) to control the heat output of the heaters 290. The number and positions of the sensors 295 are selected to promote temperature uniformity. The sensor(s) 295 can sense the temperature of wafer W1 and/or components of load lock 200b. The sensor(s) 295 can comprise any of various different sensors known in the art, such as thermocouples or transducers. In a preferred embodiment, the sensor 295 comprises a non-contact sensor, such as a pyrometer. In a further preferred embodiment, the sensor 295 senses a temperature within the upper portion 212 through a sensor window 293a in a sensor opening 291a in the cap 292b. The sensor opening 291a and window 293a can function similarly to the heater openings 291 and windows 293, but are sized and shaped to connect with and/or receive the sensor 295.

Figure 6:
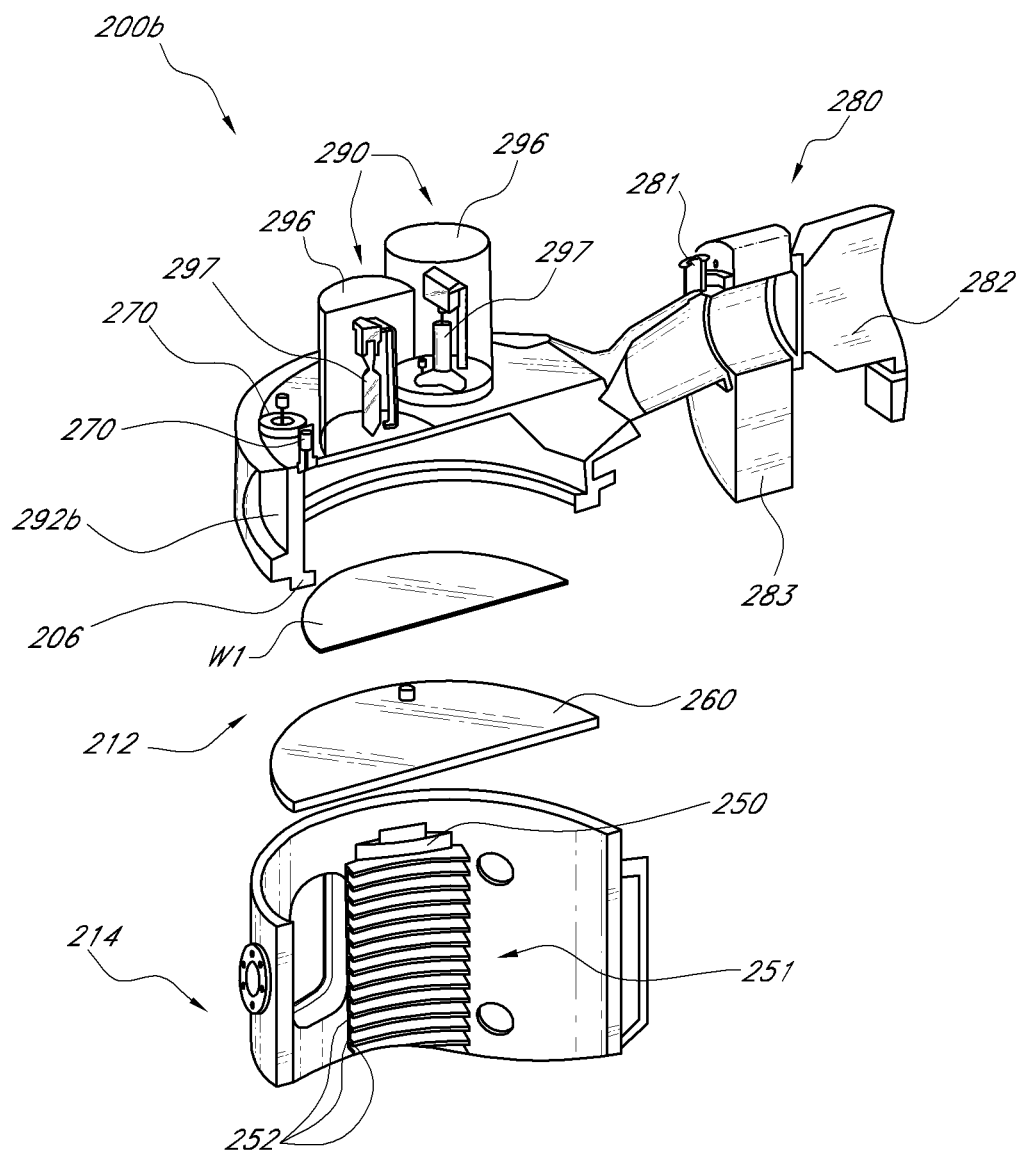
FIG. 6 illustrates a partial exploded sectioned view of a load lock.

FIG. 6 illustrates a partial exploded and sectioned view of an embodiment of the load lock 200b. The components that function similarly to other embodiments described herein have been given the same reference numerals. In the exemplary illustrated embodiment, the lower portion 214 and the components associated therewith, can be similar to a conventional load lock. For example, a conventional load lock (without an isolatable upper portion) can be represented by the load lock 200a on the left side of FIG. 4. In order to retrofit it with an upper portion, a cap 292a positioned on the top portion of the load lock 200a can be removed. Subsequently, with reference now to FIG. 6, the workpiece support 260 can be installed onto the boat 250. Fasteners can be readily released for separating and ex situ cleaning the workpiece support 260. The cap 292b of FIG. 6 can be mounted on the top portion of the load lock. In this way, a conventional load lock can be converted, or retrofitted, to comprise a load lock 200b with an upper chamber 212 capable of performing an auxiliary process as described herein.

FIG. 7 illustrates a side cross-sectional view of an exemplary embodiment of the semiconductor processing apparatus 10. The embodiment shown in FIG. 7 can function similarly to the other embodiments described herein, such as those shown in FIGS. 3A-3E. The main difference with the embodiment shown in FIG. 7 is that apparatus 10 comprises load lock 200b, which comprises the heaters 290, the sensor 295, the exhaust system 280, the inlet 270, cap portion 292b, the heater openings 291, the sensor opening 291a, and the windows 293, as described further herein. A skilled artisan will appreciate that, in other arrangements, ports 112, 210, and 310 are shown in FIG. 7 as smaller than those in FIGS. 2-3E, although the dimensions of these ports can be varied. A skilled artisan will also appreciate that load lock 200b can include a wafer handling unit 105 and port 110, as shown in FIGS. 2-3E, to allow wafer movement into and out of the upper portion 212 while it is sealed from lower portion 214.

Clean/Etch Process

In a preferred embodiment, the silicon surface of a wafer W1 can be cleaned/etched within the upper portion 212 prior to undergoing an epitaxial deposition process in chamber 400. Prior to cleaning, wafer W1 is moved onto the workpiece support 260, and the upper portion 212 is sealed from the lower portion 214, as described in the other embodiments herein. The boat 250 can be moved down such that the workpiece support 260 can be accessed by the wafer handling unit 104 through the outer port 112, or by the wafer handling unit 304 through the inner port 210. In other embodiments, where a separate port is provided for wafer passage into the upper portion 212 (e.g., FIG. 2), the wafer W1 is moved onto the workpiece support 260 after the upper portion 212 and the lower portion 214 are sealed from each other. A halide, such as hydrogen chloride (HCl), nitrogen trifluoride ($NF_3$), or preferably, hydrogen fluoride (HF), is diluted with an inert carrier gas, such as hydrogen ($H_2$), nitrogen ($N_2$), helium or argon, to form a process gas. The process gas is introduced into the upper portion 212 through one or more inlet(s) 270, to contact the surface of wafer W1. The etchant chemistry reacts with the native oxides, such as silicon oxide, and other impurities, such as carbon, on the surface of the wafer, forming volatile byproduct, such as silicon tetrafluoride (SiF4), and water vapor ($H_2O$). The byproduct can be exhausted from the upper portion 212 through the exhaust system 280, along with any remaining process gas. In a preferred embodiment, the gases are introduced and exhausted from upper portion 212 simultaneously, in a flow-through process, as described above.

In some embodiments, acetic acid vapor ($C_2H_4O_2$), or isopropyl alcohol ($C_3H_7OH$) can be introduced into upper portion 212, along with a fluorine-based etchant. For example, in a mixture of HF and acetic acid, free hydrogen is gettered by the acetic acid to form additional $H_2O$ and avoid hydroxyl attachment. HF and alcohol (e.g., isopropyl alcohol) can similarly function under similar conditions. In a preferred embodiment, the acetic acid or isopropyl alcohol are mixed with the HF at a ratio of approximately 1:1 by volume.

The cleaning process can be implemented at a variety of temperatures. In some embodiments, the cleaning process is conducted at approximately room temperature. In other embodiments, the temperature of the cleaning process can be controlled to be greater than room temperature. In some embodiments, the process gas can be heated to increase the number of free halide anions (e.g., fluorine, chlorine, etc)

contacting wafer W1, thus decreasing the reaction time and increasing the speed of the cleaning process. In a preferred embodiment, the process gas can be heated to a temperature greater than approximately 100° C. In some embodiments, the process gas may be held below a threshold temperature, to prevent excessive etching or pitting on the wafer W1. In a preferred embodiment, the process gas temperature is held below approximately 400° C. In some embodiments, the process gas temperature is maintained within a temperature range, such as approximately 100° C. to approximately 400° C. In a preferred embodiment, the process gas temperature is maintained within a temperature range of approximately 150° C. to approximately 250° C. The temperature of the process gas can be controlled by heating W1 and/or any of the components within the load lock 200b with the heaters 290 and temperature sensor 295 with closed or open loop control, or by controlling the gas temperature prior to introduction into the upper portion 212 using methods known in the art.

The cleaning process can include a purge step to introduce and exhaust an inert gas through the upper portion 212 to remove any residual process gases prior to unsealing the upper portion 212 and transferring wafer W1 therefrom. After the cleaning process, wafer W1 can be transferred to the loading station 100, lower portion 214, the handling chamber 300, or one of the process modules 400 for processing (e.g., epitaxial deposition on the cleaned wafer surface).

A skilled artisan will appreciate that the embodiments of semiconductor processing apparatus 10 and the processes described herein and illustrated in FIGS. 1-7 can be used in various pre-clean or post-clean processing sequences.

Pre-Clean Sequences

In an embodiment of a pre-clean process using the apparatus 10, the wafer 11 is loaded onto the workpiece support 260. A pre-clean process is performed on the wafer 11 while the upper portion 212 is sealed from the lower portion 214 using any of the clean processes described herein or known in the art. The wafer 11 is then unloaded from the workpiece support 260, into the handling chamber 300, and into the process module 400, where the wafer 11 is processed using any of the processes described herein, or known in the art, such as an epitaxial deposition process. Referring to FIGS. 1-7, the following describes some detailed exemplary embodiments of such a pre-clean process.

Wafer 11 can be loaded onto the workpiece support 260 and moved into upper portion 212 in a variety of ways. In an embodiment, the outer load lock port 112 is opened, and the wafer 11 is loaded from loading station 100 into one of the slots 252 of boat 250 with wafer handling unit 104 or 105. In some embodiments, a batch of wafers are loaded into the slots 252 of boat 250 during this step. The outer port 112 is then closed, the load lock 200 is purged, the inner port 210 is opened, and the wafer 11 is unloaded from the boat 250 with the wafer handling unit 304. The indexer 250 lowers the boat 250, and the wafer 11 is loaded onto the workpiece support 260 through the inner port 210 with the wafer handling unit 304. The wafer handling unit is withdrawn from the port 210, and the boat 250 is raised until the upper portion 212 is sealed from the lower portion 214.

In another loading sequence, while the boat 250 and the indexer 204 are in a lowered position, wafer 11 is loaded through the port 112 onto the workpiece support 260 using the wafer handling unit 104 or 105, as described further herein. The wafer handling unit is withdrawn from the port 112 and the boat 250 is raised, sealing the upper portion 212 from the lower portion 214.

In an alternative sequence, while the boat 250 and the indexer 204 are in a raised position and the upper portion 212 sealed from the lower portion 214, the wafer 11 is loaded through the upper port 110 (FIG. 2) onto the workpiece support 260 using the wafer handling unit 104 or 105 as described further herein. The wafer handling unit is withdrawn from the port 112, and the port 112 is closed, sealing the upper portion 212 from the load station 100. As noted above, such loading can be performed without exposing a full load in the boat 250, which remains sealed below the partition 206 during the loading process.

After the wafer 11 has been moved onto the workpiece support 260 and into upper portion 212 using one of the aforementioned sequences, the upper portion 212 can be evacuated or pressurized, relative to the lower portion 214, and/or purged, and the wafer 11 is cleaned, using any of the exemplary pre-clean processes described herein, or others known in the art. While the wafer 11 is being processed in the upper portion 212, the outer port 112 and/or the inner port 210 can be opened, allowing additional wafers to be loaded to or unloaded from the boat 250. Larger ports 112, 210 such as those shown in FIGS. 2-3E can facilitate robot access to more wafer slots while the boat 250 remains in the upper, sealed position. The inner port 210 is typically closed when wafers are moving through the outer port 112, and the outer port 112 is typically closed (sealing the lower portion 214 from the external environment) when wafers are moving through the inner port 210. In this way, additional wafers can be loaded to and unloaded from the boat 250 through the inner port 210 while a wafer 11 is being pre-cleaned in the upper portion 212. In a preferred embodiment, while the wafer 11 is being pre-cleaned, another wafer is unloaded from the boat 250 through the inner load lock port 210 using the wafer handling unit 304, loaded into the process module 400 through port 310, processed within process module 400, and returned to boat 250 using the wafer handling unit 304.

After the wafer 11 is pre-cleaned and after the upper portion 212 is returned to substantially the same pressure as the lower portion 214, the boat 250 is lowered. The inner port 210 is opened (either prior to, during, or after the boat 250 is lowered), allowing the wafer handling unit 304 to access the lower portion 214. The wafer handling unit 304 unloads the wafer 11 from the workpiece support 260 and moves the wafer 11 into the handling chamber 300 through the port 210. In some embodiments, the boat 250 is then raised, and the wafer 11 is returned to the lower portion 214 through the port 210, and loaded into one of the slots 252 in the boat 250 to await further processing. In a preferred embodiment, the inner load lock port 210 is closed, the process chamber port 310 is opened, and the wafer 11 is loaded from the handling chamber 300 into the process module 400, where the wafer 11 is processed after closing the process chamber port 310.

Post-Clean Sequences

In an embodiment of a post-clean process using the apparatus 10, after the wafer 11 is processed in the module 400, the process chamber port 310 is opened, and the wafer 11 is unloaded from the process module 400 with the wafer handling unit 304. The process chamber port 310 is closed, the inner load lock port 210 is opened, and the boat 250 is lowered with the indexer 251, allowing the wafer handling unit 304 to access the workpiece support 260 through the inner port 210. A skilled artisan will understand that the boat 250 can be lowered prior to, during or after the inner port 210 is opened. The wafer 11 is then loaded onto the workpiece support 260 through the inner port 210 with the wafer handling unit 304. The boat 250 is then moved into the upper portion 212 with indexer 251, and the upper portion 212 is sealed from the lower portion 214. A post-clean process is then performed on the wafer 11 using any of the processes described herein or known in the art.

After the post-clean process, the wafer 11 can be unloaded from the workpiece support 260 in a variety of ways. In some embodiments, such as that shown in FIGS. 2-3E, the upper portion 212 is purged and backfilled to return to ambient pressure (if the post-clean process created a pressure differential between upper portion 212 and the loading station 100), the port 110 is opened, and the wafer 11 is unloaded from the upper portion 212 and into the loading station 100 through the upper port 110 using the wafer handling unit 104.

In other embodiments, such as those shown in FIGS. 1-7, the upper portion 212 is purged and backfilled to return to the same pressure as the lower portion 214 (if the post-clean process created a pressure differential between the upper portion 212 and the lower portion 214), and the workpiece support 260 is moved into lower portion 214 with the indexer 251. In some embodiments, the port 112 is then opened, and the wafer 11 is unloaded from the workpiece support 260 to the loading station 100 through port 112 using the wafer handling unit 104. In alternative embodiments, the port 210 is then opened, and the wafer 11 is unloaded to the handling chamber 300 through port 210 using the wafer handling unit 304. After the wafer 11 is unloaded to the handling chamber 300, it can be moved to the processing module 400 by wafer handling unit 304 to undergo further processing, or it can be reloaded into one of the slots 252 in the boat 250 through the inner port 210. After the wafer 11 is loaded into one of the slots 252 in the boat 250, the wafer can await further processing in processing module 400, or can be unloaded from boat 250 into loading station 100 through port 112 by wafer handling units 104 or 105 at the same time as the entire batch.

It will be understood by a skilled artisan that a controller (not shown) can be used to control the various components and sequences for using system 10 described herein. The controller can be in many forms as is known to those of skill in the art. For example, the controller can comprise a memory and/or a computer control system programmed for any of the above sequences. The control system can include modules such as a software and/or a hardware component, such as a FPGA or ASIC, which performs certain tasks. A module may advantageously be configured to reside on the addressable storage medium of the computer control system and be configured to execute on one or more processors.

While certain embodiments of the present invention have been described, it should be understood that the present invention is not so limited and modifications thereof may be made without departing from the present invention. The scope of the present invention is defined by the appended claims, and all devices, process, and methods that come within the meaning of the claims, either literally or by equivalence, are intended to be embraced therein.

What is claimed is:

1. A method of transporting workpieces, the method comprising:
    loading a workpiece into a boat through a first port in communication with a first portion of a chamber of a load lock, the boat disposed in the chamber;
    transferring the workpiece to a workpiece holder mounted on a first surface of the boat;
    moving the boat towards a partition between the first portion of the chamber and a second portion of the chamber to sealably engage the partition with the first surface of the boat, wherein moving the boat comprises moving the workpiece holder into the second portion of the chamber, and sealably engaging the partition with the first surface of the boat;
    increasing the pressure of the second portion of the chamber;
    processing the workpiece in a process module after loading and before transferring the workpiece to the workpiece holder; and
    unloading the workpiece through a second port in communication with the second portion of the chamber.

2. The method of claim 1, wherein the first portion of the chamber comprises a lower portion of the chamber and wherein the second portion of the chamber comprises an upper portion of the chamber.

3. The method of claim 1, further comprising, while unloading the workpiece, processing a second workpiece in a process module.

4. The method of claim 1, further comprising measuring a parameter of the workpiece with a metrology apparatus in the second portion of the chamber.

5. A method of transporting workpieces, the method comprising:
    loading a workpiece into a boat through a first port in communication with a first portion of a chamber of a load lock, the boat disposed in the chamber;
    transferring the workpiece to a workpiece holder mounted on a first surface of the boat;
    moving the boat towards a partition between the first portion of the chamber and a second portion of the chamber to sealably engage the partition with the first surface of the boat, wherein moving the boat comprises moving the workpiece holder into the second portion of the chamber, and sealably engaging the partition with the first surface of the boat;
    increasing the pressure of the second portion of the chamber;
    measuring a parameter of the workpiece with a metrology apparatus in the second portion of the chamber;
    changing a condition in a process module based on the measured parameter; and
    unloading the workpiece through a second port in communication with the second portion of the chamber.

6. A method of transporting workpieces, the method comprising:
    loading a workpiece into a boat through a first port in communication with a first portion of a chamber of a load lock, the boat disposed in the chamber;
    transferring the workpiece to a workpiece holder mounted on a first surface of the boat;
    moving the boat towards a partition between the first portion of the chamber and a second portion of the chamber to sealably engage the partition with the first surface of the boat, wherein moving the boat comprises moving the workpiece holder into the second portion of the chamber, and sealably engaging the partition with the first surface of the boat;
    increasing the pressure of the second portion of the chamber;
    cleaning the workpiece in the second portion of the chamber; and
    unloading the workpiece through a second port in communication with the second portion of the chamber.

7. A method of transporting workpieces, the method comprising:
    loading a workpiece into a boat through a first port in communication with a first portion of a chamber of a load lock, the boat disposed in the chamber;

transferring the workpiece to a workpiece holder mounted on a first surface of the boat;
moving the boat towards a partition between the first portion of the chamber and a second portion of the chamber to sealably engage the partition with the first surface of the boat, wherein moving the boat comprises moving the workpiece holder into the second portion of the chamber, and sealably engaging the partition with the first surface of the boat;
increasing the pressure of the second portion of the chamber;
heating the workpiece in the workpiece holder while in the second portion of the chamber with a heater; and
unloading the workpiece through a second port in communication with the second portion of the chamber.

8. A method of transporting workpieces, the method comprising:
loading a workpiece into a boat through a first port in communication with a first portion of a chamber of a load lock, the boat disposed in the chamber;
transferring the workpiece to a workpiece holder mounted on a first surface of the boat;
moving the boat towards a partition between the first portion of the chamber and a second portion of the chamber to sealably engage the partition with the first surface of the boat, wherein moving the boat comprises moving the workpiece holder into the second portion of the chamber, and sealably engaging the partition with the first surface of the boat;
increasing the pressure of the second portion of the chamber; and
unloading the workpiece through a second port in communication with the second portion of the chamber,
wherein the first portion of the chamber is sized and shaped to accommodate no less than ten workpieces, and the second portion of the chamber is sized and shaped to accommodate no greater than four workpieces.

9. The method of claim 8, wherein the workpiece holder is configured to hold no greater than two workpieces.

10. A method of processing a substrate, comprising:
loading a substrate onto a workpiece holder in a load lock, the load lock comprising a chamber having a first portion, a second portion, and a partition between the first portion and the second portion, the workpiece holder moveable between the first portion and the second portion;
sealing the first portion from the second portion by sealingly engaging a boat with the partition, wherein the workpiece holder is mounted on the boat;
pre-cleaning the substrate by introducing cleaning chemicals into the second portion of the load lock;
unloading the substrate from the workpiece holder;
transferring the substrate from the load lock to a process chamber; and
performing an epitaxial deposition process on the substrate in the process chamber.

11. The method of claim 10, wherein pre-cleaning comprises introducing a halide into the second portion of the loadlock.

12. The method of claim 11, wherein the halide comprises hydrogen fluoride and either an alcohol or acetic acid.

13. The method of claim 10, further comprising heating the workpiece in the workpiece holder while in the second portion of the load lock with a heater.

14. The method of claim 10, wherein loading the substrate onto a workpiece holder comprises loading the substrate onto the workpiece holder through a port in fluid communication with the first portion of the chamber.

15. The method of claim 14, wherein sealing the first portion from the second portion comprises moving the workpiece holder into the second portion of the chamber to sealingly engage the boat with the partition.

16. The method of claim 10, further comprising measuring a parameter of the workpiece in the second portion of the chamber with a metrology apparatus.

17. The method of claim 16, further comprising changing a condition in a process module based on the measured parameter.

18. The method of claim 10, wherein the first portion of the chamber is sized and shaped to accommodate no less than ten workpieces, and the second portion of the chamber is sized and shaped to accommodate no greater than four workpieces.

19. The method of claim 18, wherein the workpiece holder is configured to hold no greater than two workpieces.

20. The method of claim 5, further comprising processing the workpiece in a process module after loading and before transferring the workpiece to the workpiece holder.

21. The method of claim 6, further comprising processing the workpiece in a process module after loading and before transferring the workpiece to the workpiece holder.

22. The method of claim 7, further comprising processing the workpiece in a process module after loading and before transferring the workpiece to the workpiece holder.

23. The method of claim 8, further comprising processing the workpiece in a process module after loading and before transferring the workpiece to the workpiece holder.

* * * * *